United States Patent [19]
Furukawa et al.

[11] Patent Number: 5,922,126
[45] Date of Patent: Jul. 13, 1999

[54] SEMICONDUCTOR LIQUID PHASE EPITAXIAL GROWTH METHOD AND APPARATUS, AND ITS WAFER HOLDER

[75] Inventors: Kazuyoshi Furukawa, Kawasaki; Masami Iwamoto, Setagaya-ku, both of Japan

[73] Assignee: Kabushiki Kaisha Toshiba, Kawasaki, Japan

[21] Appl. No.: 08/866,259

[22] Filed: May 30, 1997

[30] Foreign Application Priority Data

May 31, 1996 [JP] Japan .................................. 8-138976

[51] Int. Cl.⁶ .................................................. C30B 19/06
[52] U.S. Cl. .................... 117/54; 117/57; 117/60; 118/405
[58] Field of Search .................. 117/54, 57, 60; 118/405

[56] References Cited

U.S. PATENT DOCUMENTS

| | | | |
|---|---|---|---|
| 5,407,858 | 4/1995 | Yanagisawa et al. | 117/54 |
| 5,512,511 | 4/1996 | Kalisher | 117/60 |
| 5,529,938 | 6/1996 | Umeda et al. | 117/56 |
| 5,603,762 | 2/1997 | Kokune et al. | 117/60 |

FOREIGN PATENT DOCUMENTS

| | | | |
|---|---|---|---|
| 53-44311 | 11/1978 | Japan | 117/56 |
| 60-21897 | 2/1985 | Japan . | |
| 60-115271 | 6/1985 | Japan . | |
| 61-31385 | 2/1986 | Japan . | |
| 62-83398 | 4/1987 | Japan . | |
| 63-50392 | 3/1988 | Japan . | |
| 63-159289 | 7/1988 | Japan | 117/54 |
| 64-61385 | 3/1989 | Japan | 117/56 |
| 4 160092 | 6/1992 | Japan . | |

OTHER PUBLICATIONS

Blum et al., "Liquid Phase Epitaxy Growth of DH Laser Arrays", IBM Technical Disclosure Bulletin, vol. 15, No. 7. p. 2091, Dec. 1972.

*Primary Examiner*—Robert Kunemund
*Attorney, Agent, or Firm*—Oblon, Spivak, McClelland, Maier & Neustadt, P.C.

[57] ABSTRACT

The disclosed semiconductor liquid phase epitaxial growth method and apparatus and the wafer holder used therefor can improve the deposition of polycrystal, the non-uniformity of film thickness, the thermal deterioration of the substrate, etc. The wafer holder comprises a holder body (11) formed with at least one wafer accommodating space in which at least two semiconductor wafers (15) can be held in such a way that reverse surfaces of the two wafers are brought into contact with two opposing inner side walls of the wafer holder and right surfaces of the two wafers are opposed to each other with a predetermined space between the two; and a holder cover (12) for covering an open surface of the holder body (11). Further, the holder body (11) is formed with an inlet port (16) for injecting a source into the wafer accommodating space and an outlet port (13) for exhausting the source from the wafer accommodating space.

24 Claims, 14 Drawing Sheets

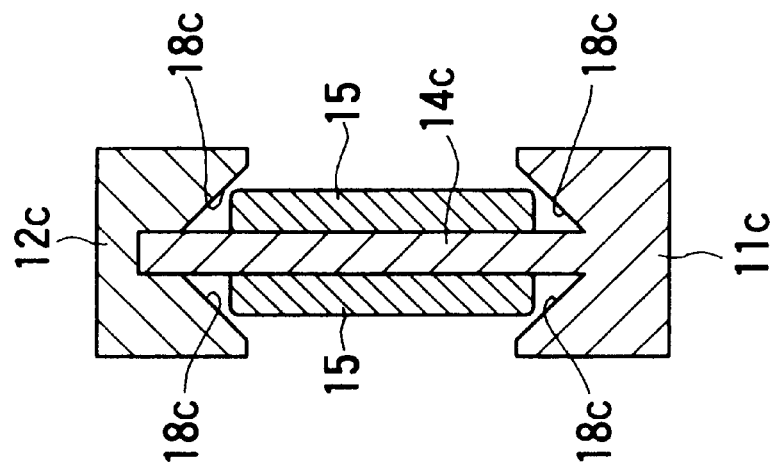
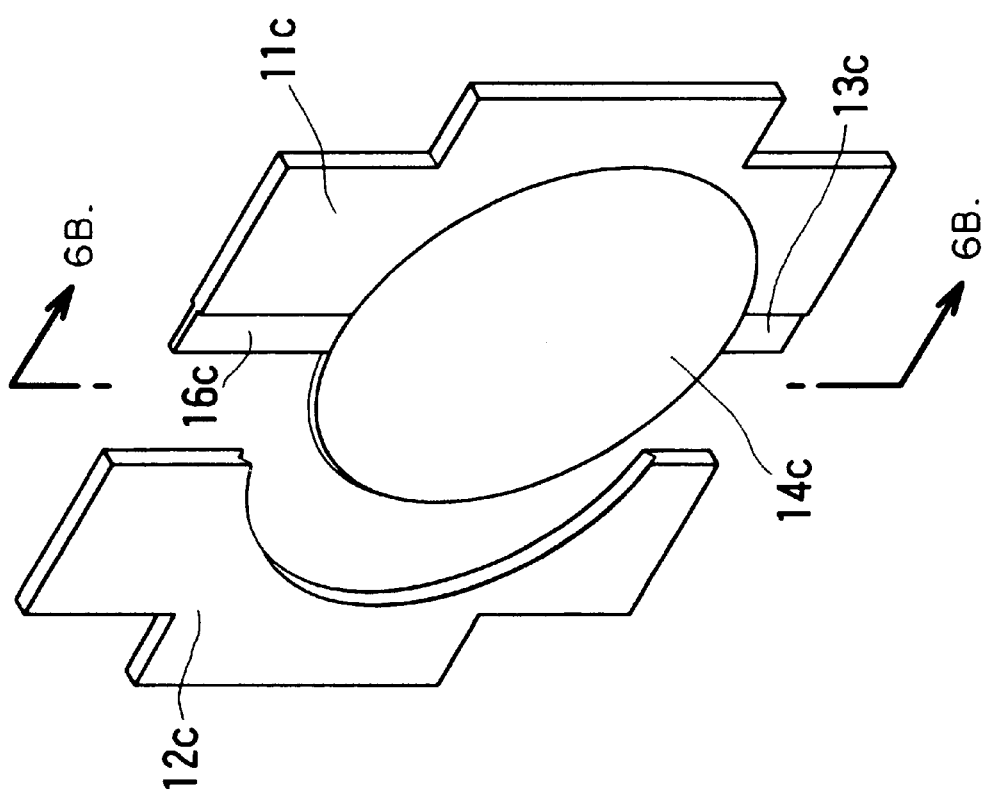
FIG. 6(a)
FIG. 6(b)

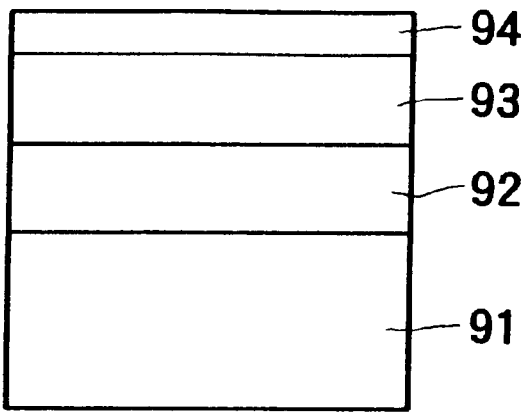
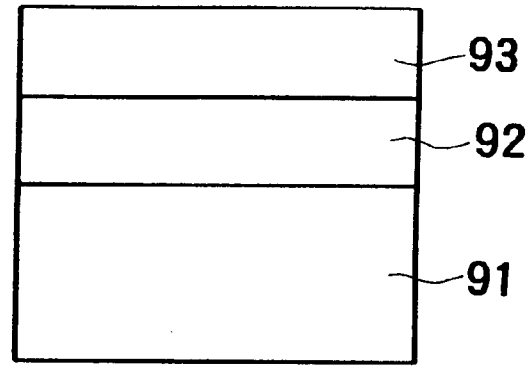
FIG. 12(a)   FIG. 12(b)
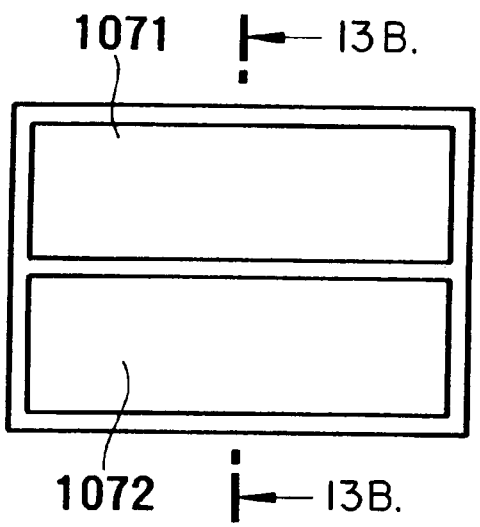
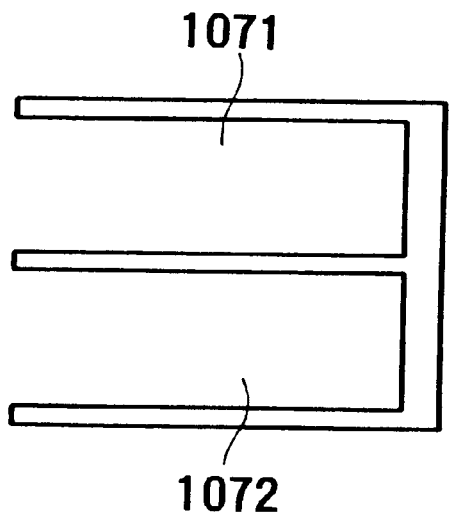
FIG. 13(a)   FIG. 13(b)

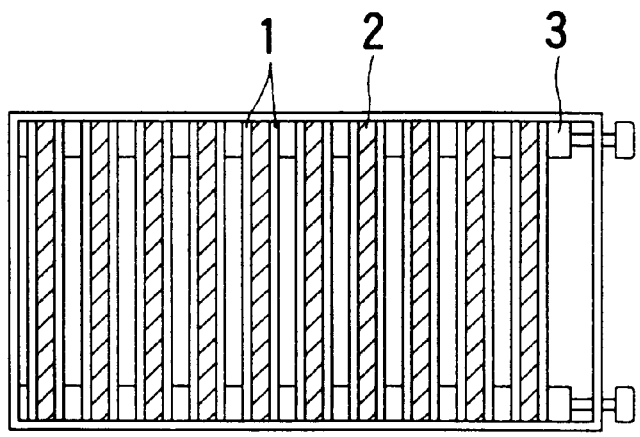
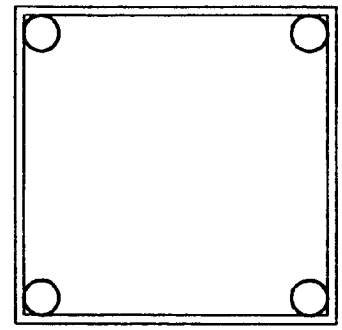
FIG. 17(a)   FIG. 17(b)
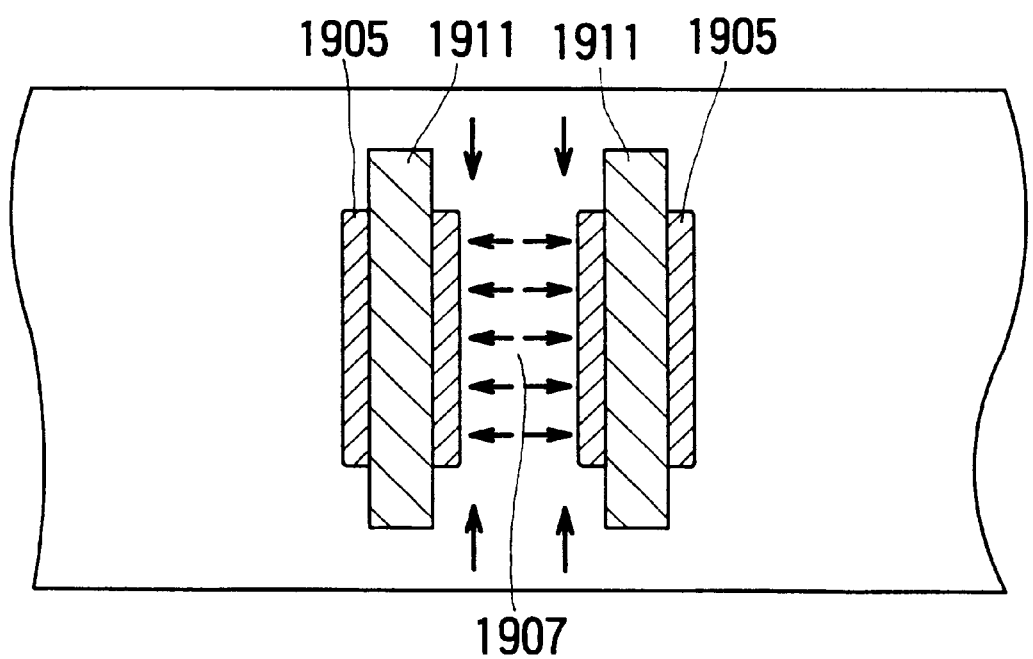
FIG. 18

5,922,126

SEMICONDUCTOR LIQUID PHASE EPITAXIAL GROWTH METHOD AND APPARATUS, AND ITS WAFER HOLDER

BACKGROUND OF THE INVENTION

1. Field of the Invention

The present invention relates to a semiconductor liquid phase epitaxial growth method and apparatus for forming a semiconductor layer on a semiconductor wafer on the basis of epitaxial growth by use of an epitaxial layer growing liquid source, and a wafer holder for accommodating and holding wafers for the epitaxial growth.

2. Description of the Prior Art

The liquid phase epitaxial growth method is such a technique that a source is formed by dissolving a semiconductor material for epitaxial growth in a liquefied low-melting point metal used as a solvent; the formed source is brought into contact with a semiconductor wafer; and then the temperature of the source is lowered to deposit the dissolved semiconductor on a wafer as an epitaxial growth layer. This technique is adopted to obtain an epitaxial growth layer of a compound semiconductor such as GaP (gallium phosphide), GaAs (gallium arsenide), AlGaAs aluminum gallium arsenide), etc. by use of Ga (gallium) as a solvent or to obtain an epitaxial growth layer of a Si (silicon) epitaxial growth layer by use of Ga (gallium) or Sn (tin) as a solvent.

In principle, the liquid phase epitaxial growth method comprises a step of bringing the source into contact with a wafer; a step of lowering the temperature of the source; and a step of separating the source from the wafer where necessary. According to the method of bringing or separating the source into contact with or from the wafer, various liquid phase epitaxial growth methods and apparatus have been so far known, for instance such as source injection method, dipping method, slide boat method, etc.

In the case of the source injection method, wafers are accommodated in a wafer holder and then disposed in an epitaxial growth chamber, and then the source is injected into the epitaxial growth chamber for epitaxial growth.

An example of the prior art source injection method and apparatus will be explained hereinbelow with reference to FIGS. 14(a), 14(b) and 14(c).

The epitaxial growth apparatus as shown in the drawings is generally referred to as a boat, and used in a horizontal or vertical furnace. FIGS. 14(a) to 14(c) show the case where the boat is used in a horizontal furnace. FIG. 14(a) shows the state where the boat is placed in the furnace before epitaxial growth, in which, however, the furnace and quartz tube are all not shown. In FIG. 14(a), the boat is mainly composed of a body 5501, a source sump 5502, and an exhaust source sump 5503. Further, a partition plate 5504 is disposed between the body 5501 and the exhaust source sump 5503. Further, an epitaxial growth chamber 5506 for accommodating wafers 5505 for epitaxial growth is formed in the body 5501. The source sump 5502 and the partition plate 5504 are both slidable in the horizontal direction, so that these elements can be moved right and left during the epitaxial growth process by use of a quartz rod inserted into the quartz tube from the outside.

For the epitaxial growth, as shown in FIG. 14(a), wafers 5505 are mounted in the epitaxial growth chamber 5506. As shown in FIG. 14(b), the wafers 5505 are held vertically, or obliquely with respect to the horizontal direction. Further, in FIGS. 14(a) to 14(c), a mechanism (a wafer holder) for holding the wafers is not shown. An epitaxial source raw material is put in the source sump 5502. In the case of the GaAs epitaxial growth, for instance, the epitaxial source raw material is metal Ga (as the solvent), poly GaAs (as the epitaxial growth material), and Si (as dopant), which are all are added into the source sump.

Under these conditions, when the boat is introduced into the furnace and then the furnace temperature is raised to such a high temperature that the source raw material metal Ga can be melted and thereby a source 5507 saturated with the dissolved epitaxial growth raw material can be obtained. To obtain the source 5507, a relatively long time (longer than one hour, in general) is necessary. When the source 5507 has been obtained, as shown in FIG. 14(b), the source sump 5502 is slid to the right or left side in the horizontal direction to fit a hole 5081 formed in the source sump 5502 to a source passage 5509. By doing this, the source 5507 can flow into the epitaxial chamber 5506 through the source passage 5509, so that the source is brought into contact with the wafers 5505. In the state where the source 5507 is in contact with the wafers 5505, when the temperature is lowered, the epitaxial growth raw material over-saturated in the source 5507 is deposited on the wafers as an epitaxial growth layer, respectively.

At a time when an epitaxial growth layer of any desired amount has been obtained, as shown in FIG. 14(c), the partition plate 5504 is slid to the right or left side in the horizontal direction to fit a hole 5085 formed in the partition plate 5505 to an exhaust hole 5083 formed in the epitaxial growth chamber 5506. By doing this, the used epitaxial source 5507 can drop into the exhaust source sump 5503, so that the epitaxial growth process ends.

In FIGS. 14(a) to 14(C), the epitaxial growth method and apparatus for forming only a single epitaxial layer have been explained. In the source injection method, generally, after the source used for the epitaxial growth has been exhausted, a new source is injected again for an additional epitaxial layer, to obtain a multi-layer epitaxial growth layer.

FIG. 15 shows an example of the apparatus used for the two-layer epitaxial growth. A source sump 6602 is partitioned right and left, as a first source 6071 and a second source 6072. Each of the separated source sumps is formed with each inlet port 6081 and 6082. Therefore, when the source sump 6602 is moved to the right side and the left side, it is possible to obtain two epitaxial growth layers continuously, by first injecting the raw material of the first source 6071 disposed on the left side, by exhausting the first source, and by injecting the raw material of the second source 6072 disposed on the right side.

In the case of the dipping method, a source sump in which a source raw material is put is placed in a heating furnace; the source raw material is dissolved by heat as an epitaxial growth source; and then wafers are dipped into the source. After that, the temperature of the heating furnace is lowered for epitaxial growth. After the epitaxial growth of any desired film thickness has been obtained, the wafers are pulled upward from the source to complete the epitaxial growth process.

In the case of the slide boat method, wafers are held on a wafer holder; a slider having a source is placed on the wafers and then heated. After the source has been heated up to a predetermined temperature, the slider is moved to bring the source into contact with the wafers for epitaxial growth.

In the above-mentioned prior art liquid phase epitaxial growth methods, however, there exist some problems related to the principle. These problems will be described in further detail hereinbelow in association with the epitaxial growth methods and the wafer holder for holding the wafers.

(1) Polycrystal deposition and film thickness non-uniformity

In the liquid phase epitaxial growth method, an over-saturated solute is deposited and grown on a wafer. Here, the solute can reach the wafer being moved in the source on the basis of diffusion caused by a concentration gradient generated by deposition. Therefore, the solute of the source located far away from the wafer cannot reach the wafer, with the result that the solute is deposited as polycrystal in the source or on the wall surface of the boat.

Here, since the polycrystal is grown non-uniformly, when the solute is deposited in the source near the epitaxial growth surface of the wafer or the opposite surface or the peripheral surface of the wafer, the epitaxial growth is prevented by the polycrystal deposition of the polycrystal, with the result that the film thickness of the epitaxial growth is not uniform.

In the injection method, although the source passage for introducing the source from the source sump to the epitaxial growth chamber is essential, since the polycrystal is easy to be deposited in the source passage, the deposited polycrystal prevents the source from flowing through the source passage. This phenomenon causes a serious problem when after the first semiconductor layer has been grown, the source is exchanged for another source for the second semiconductor layer.

In the dipping method, the polycrystal deposited on the outer edge or the peripheral portion of the wafer causes a problem. When the epitaxial layer is grown by simply dipping the wafer into the source, it is a matter of course that the solute is deposited and grown on the reverse surface of the wafer. In order to overcome this problem, Japanese Published Unexamined Patent Application No. 4-160092 discloses such a method as shown in FIGS. 16(a) and 16(b). In this prior art method, each of wafers 14 is placed in each of laboratory dishes 13; a plurality of the dishes are stacked upon each other and further fixed by use of a cassette 15; and then the cassette 15 is placed in the source 12 for epitaxial growth.

In this method, since the reverse surface of each wafer is brought into tight contact with the dish surface (without being brought into contact with the source), an epitaxial growth is not obtained on the reverse surface of the wafer. Further, when a plurality of the dishes are used, it is possible to obtain an epitaxial growth layer on a plurality of the wafers, respectively at a time.

On the other hand, since the epitaxial growth is performed by holding the wafers on the dishes horizontally, after the epitaxial growth has been completed, when the wafers and the wafer holders are pulled out of the source, since the source remains on the upper surfaces of the wafers, it is impossible to end the epitaxial growth quickly. As a result, it is impossible to control the film thickness of the semiconductor layer precisely. In addition, since the amount of the remaining source is not uniform, the thickness of the epitaxial growth layer disperses among the wafers and additionally on the surface of the same wafer. Further, the flatness of the surface of the epitaxial growth layer is degraded.

Further, since polycrystal is easily deposited on the bottom surface of the dish which is opposed to the upper surface of the wafer, there exists another problem in that the film thickness of the epitaxial growth layer is not uniform.

To overcome this problem, Japanese Patent Laid-Open No. 60-21897 discloses such a method as shown in FIG. 17. In this dipping method, each of the wafer reverse surfaces is brought into tight contact with a spacer.

In this dipping method, however, nothing is considered of the diffusion of the solute from the periphery of the wafer and the deposition of the solute onto the wafer edge portion. In more detail, FIG. 18 shows a state where wafers 1905 are dipped into a source 1907 for epitaxial growth, in which since the reverse surfaces of the wafers 1905 are brought into tight contact with two spacers 1911, respectively, the reverse surfaces of the wafers 1905 are free from epitaxial growth. In this case, however, as already explained, in the liquid phase epitaxial growth, since the solute in the source contacting with the surface of the wafer diffuses onto the wafer edge, epitaxial growth occurs. As shown in FIG. 18 simply, at the central portion of the wafer 1905, only the source existing between the two opposing wafers contributes to the epitaxial growth. In contrast with this, in the edge portion of the wafer 1905, the source existing at the periphery of the wafer also contributes to the epitaxial growth. As a result, since the thickness of the epitaxial growth becomes larger at the edge portion than at the central portion thereof, there exists a problem in that the thickness of the epitaxial growth layer is not uniform on the same surface of the wafer, so that the uniformity of the intra-surface film thickness deteriorates.

Further, in general, since the edge portion of the wafer is chamfered, the crystal orientation is different between the central portion and the edge portion of the wafer surface. In addition, since the wafer surface is rough, there exists another problem in that abnormal epitaxial growth (e.g., polycrystal growth) easily occurs at the chamfered edge of the wafer.

Further, in the case of the dipping method, since the solute is deposited in the source within the source sump and further since the solute is more light than the solvent Ga, the deposited solute floats on the surface of the solvent. Therefore, the solute (e.g., polycrystal GaAs) deposited under the wafer holder during the epitaxial growth adheres onto the wafer or the wafer holder in the source. Further, the solute floating on the source surface during the epitaxial growth adheres onto the upper portion of the wafer, when the wafer is being pulled upward after the end of the epitaxial growth.

As described above, in the Japanese Patent Laid-Open No. 60-21897, nothing is considered of the abnormal growth at the peripheral portion of the wafer, of the non-uniform film thickness of the epitaxial growth, and of the solute deposited in the source.

(2) Thermal deterioration of wafer

Since the vapor pressure of As is high, when GaAs wafer is exposed to a high temperature, As is vaporized from the surface of the GaAs wafer, so that the surface thereof deteriorates. To prevent the vaporization of As, it is necessary to place the wafer in as airtight and narrow a space as possible, in order to prevent As from vaporization by increasing the As vapor pressure at the wafer periphery, without placing the wafer at high temperature for many hours. In the heat treatment of the GaAs wafer, for instance, a cap anneal method is adopted such that an oxide silicon film is formed on the surface of the wafer to prevent As form being vaporized.

In the case of the liquid phase epitaxial growth, however, since a long time and a high temperature (higher than that for epitaxial growth) are required to dissolve the source raw material, the wafer is exposed to a high temperature, even at the preparatory stage before the epitaxial growth begins. Further, since the epitaxial surface of the wafer must be brought into contact with the source, it is impossible to perfectly cover the wafer surface.

In the injection method, since the wafer is held within the boat located under the source and then inserted into the high temperature section of the furnace together with the source raw material, the wafer is exposed to the high temperature for a further long time. In addition, since the source injecting passage communicates with the epitaxial growth chamber in which the wafer is placed, it is impossible to air-tightly seal the wafer within a narrow space.

In the dipping method, it is possible to place the wafer at a low temperature section prepared inside or outside the heating furnace, until the preparatory process of the epitaxial growth has been completed. However, immediately before the dipping, since the wafer must be preheated up to near the same temperature as that of the source, it is impossible to prevent the thermal deterioration at this stage.

Japanese Patent Laid-Open No. 60-115271 discloses a method of placing wafers at a low temperature section with respect to the epitaxial growth of GaP. In this method, during preheating, the wafer is placed over the liquid surface of the source within a source sump, so that the wafer can be closed tightly by placing a lid onto the source sump.

In this disclosed method, however, the source sump is closed by use of a lid, only to prevent a dopant source (i.e., oxygen) from being vaporized from the epitaxial growth source. Therefore, since the space within the source sump is large, it is impossible to perfectly prevent the wafer from thermal deterioration.

Further, in the method of placing the wafer at a low temperature portion outside the heating furnace, the temperature gradient within a reaction tube in which a substrate is placed drops abruptly, beginning from the portion of the reaction tube extending from the furnace to the outside. Therefore, there exists a problem in that when the substrate is placed outside the furnace, a large temperature distribution occurs on the surface of the substrate, so that a thermal stress is generated. Further, when the wafers are moved downward to a high temperature section within the furnace, since a large temperature difference occurs, there exists a problem in that a thermal stress occurs. Once the thermal stress occurs, the substrate is warped, so that the crystal defect may occur.

(3) Non-uniform composition of epitaxial growth source

For instance, in the case of the liquid phase epitaxial growth of GaAs, the epitaxial growth source is obtained by putting the solvent metal Ga, the epitaxial growth material of poly GaAs, and the dopant of Si into a source sump and then by increasing the temperature of the source sump. In this process, it is difficult to obtain a uniform solvent on the basis of only the natural diffusion. This is because since the As is more light in weight than Ga, the concentration of As increases near the surface of the source, so that Ga tends to be non-saturated at the bottom portion of the source sump. Further, in the case of the epitaxial growth raw material containing a small amount of dopant, there exists a problem in that the source tends to be non-uniform. This is because the epitaxial growth raw material is supplied in the form of solid, it is impossible to place the raw material uniformly within the source sump.

To overcome this problem, it may be considered that the source is stirred within the source sump. However, in the aforementioned boat used in the horizontal furnace, since the stirring motion must be made in the horizontal direction, it has been difficult to arrange a stirring device or mechanism.

Further, in the dipping method using a vertical furnace, although it is relatively easy to arrange the stirring mechanism, there exists a problem with respect to the saturation degree of the source during the wafer dipping process. If the source is not saturated, there exists a problem in that immediately when the source is brought into contact with the wafer, the solute is dissolved. This problem occurs, irrespective of the epitaxial growth method. However, when the source is over-saturated, the deposited solute covers the wafer surface. Therefore, in the dipping method, in particular there exists such a restriction that the source must not be kept over-saturated.

(4) Residual and mixing of epitaxial growth raw material

When a multi-layer epitaxial growth (i.e., two or more layers) is made by the injection method, after the first source has been exhausted, the second source is injected. In this case, however, polycrystal of the first source is deposited and adhered onto the wafer. In the source injection method in particular, since there is a large space in the source passage, a source flows in larger quantities than those required for the epitaxial growth, the above-mentioned phenomenon becomes more conspicuous. The adhered substance cannot be exhausted even in the source exhaust process, and thereby remains within the boat body together with the source containing the adhered substance. Therefore, when the second source is injected, the second source is inevitably mixed with the first source.

For instance, when AlGaAs epitaxial growth is made after the GaAs epitaxial growth, since the AlGaAs source is mixed with GaAs source, there arises a problem in that the mixed crystal ratio of Al in the AlGaAs layer is reduced or becomes non-uniform or that the dopant concentration cannot be controlled.

In the case of the dipping method, the multi-layer epitaxial growth is made by preparing a plurality of sources and source sumps and by dipping the wafer into the sources in sequence. In the aforementioned Japanese Patent Laid-Open No. 4-160092, as shown in FIG. 16, since the wafer is accommodated in the dish-shaped wafer holder, it is difficult to exhaust the source. Therefore, the source remaining on the wafer is easily mixed with another source, so that the source composition is easily changed, thus causing a problem in that it is difficult to obtain an epitaxial growth layer of desired film thickness and composition.

SUMMARY OF THE INVENTION

With these problems in mind, therefore, it is the object of the present invention to provide a semiconductor liquid phase epitaxial growth method and apparatus, which can solve various problems so far involved in the prior art epitaxial growth technique such as the deposition of polycrystal, the non-uniformity of film thickness, the thermal deterioration of wafers, the residual and mixing of the epitaxial growth raw material, etc., and a wafer holder used for the epitaxial growth method according to the present invention.

To achieve the above-mentioned object, the present invention provides a wafer holder, comprising: a holder body having: at least one wafer accommodating space in which at least one pair of semiconductor wafers can be held in such a way that reverse surfaces of the two wafers are brought into contact with inner side walls thereof and right surfaces of the two wafers are opposed to each other with a predetermined space between the two; and an inlet and outlet port for injecting and exhausting a source into and out of the wafer accommodating space or an inlet port for injecting the source into the wafer accommodating space and an outlet port for exhausting the source from the wafer a accommodating space; and a holder cover for covering an open surface of the holder body.

Further, the present invention provides a holder body, comprising at least two sets of: a holder plate having a disk-shaped wafer holding plate formed with a U-shaped or semi-circular groove portion formed so as to enclose a peripheral portion of the disk-shaped wafer holding plate except an opening surface of the wafer holding plate, a least two of semiconductor wafers being fitted to the groove portion in such a way that two reverse surfaces of the two semiconductor wafers are brought into contact with both surfaces of the wafer holding plate, respectively in back-to-back arrangement; and a holder cover formed with a U-shaped or semi-circular groove portion so as to be fitted to the outer peripheries of the semiconductor wafers and to cover the opening surface of the wafer holding plate, the outer edges of the semiconductor wafers held by the wafer holding plate being further held by the groove portion of the holder cover; and wherein when the holder plates and the holder covers are stacked upon each other, two right surfaces of the two semiconductor wafers being opposed to each other two by two with a predetermined space between the two.

Further, the present invention provides a holder body, comprising at least two sets of: a holder plate having a wafer holding plate formed with a U-shaped or semi-circular groove portion formed so as to enclose a peripheral portion of the wafer holding plate except an opening surface of the wafer holding plate, an outer edge of the semiconductor wafer being fitted to the groove portion in such a way that a reverse surface of one semiconductor wafer is brought into contact with an inner bottom surface of the wafer holding plate; and a holder cover formed with a U-shaped or semi-circular groove portion so as to be fitted to the outer periphery of the semiconductor wafer and to cover the opening surface of the wafer holding plate, the outer edge of the semiconductor wafer held by the wafer holding plate being further held by the groove portion of the holder cover; and wherein another holder plate is mounted on an upper surface of a set of the holder plate and the holder cover for holding a single semiconductor wafer in such a way that another semiconductor wafer can be sandwiched between the two holder plates, two right surfaces of the two semiconductor wafers being opposed to each other two by two with a predetermined space between the two.

The present invention provides an epitaxial growth apparatus, comprising: a source sump for accommodating a source used for liquid phase epitaxial growth; an epitaxial growth chamber located under the source sump, for accommodating semiconductor wafers; a source passage provided between the source sump and the epitaxial growth chamber; and a front chamber disposed in a part of the source passage, and wherein when the source accommodated in the source sump is introduced into the epitaxial growth chamber through the source passage, the source is stirred in the front chamber.

Further, the present invention provides a semiconductor liquid phase epitaxial growth apparatus, comprising: a heating furnace having: a high temperature uniform-heat section heated by heating means so as to form a roughly uniform temperature distribution, and a low temperature section located over the high temperature uniform-heat section and kept at a temperature lower than that of the high temperature uniform-heat section; gas supplying means for supplying a reducing gas and/or an inert gas into the heating furnace; a source sump disposed at the high temperature uniform-heat section in the heating furnace, for accommodating a source in which a solute containing semiconductor material used for epitaxial growth is dissolved in a solvent containing a metal; a wafer holder for holding a plurality of semiconductor wafers; wafer holder moving means for moving the wafer holder in vertical direction in the heating furnace, to dip the semiconductor wafers held by the wafer holder into the source accommodated in the source sump during epitaxial growth; stirring means having a stirring blade for stirring the source accommodated in the source sump; and blade moving means for moving the stirring means in the vertical direction to put the stirring means into or out of the source.

Further, the present invention provides a semiconductor liquid phase epitaxial growth method comprising: a step of holding a plurality of semiconductor wafers by a wafer holder; a step of accommodating the semiconductor wafers held by the wafer holder in an epitaxial growth chamber; a step of flowing a reducing gas and/or an inert gas into the epitaxial growth chamber; a step of heating the epitaxial growth chamber to a predetermined temperature; a step of flowing a source accommodated in a source sump into a front chamber for stirring; a step of introducing the source into the epitaxial growth chamber to bring the source into contact with the semiconductor wafers; a step of lowering temperature of the epitaxial growth chamber, for epitaxial growth on the semiconductor wafers; and a step of exhausting the source from the epitaxial growth chamber to complete the epitaxial growth.

Further, the present invention provides a semiconductor liquid phase epitaxial growth method comprising: a step of holding a plurality of semiconductor wafers by a wafer holder; a step of holding the wafer holder for holding the semiconductor wafers, in a low temperature region of a heating furnace having a high temperature uniform-heat region heated by heating means to form a roughly uniform temperature distribution and the low temperature region located over the high temperature uniform-heat region and kept at a temperature lower than that of the high temperature uniform-heat region; a step of flowing a reducing gas and/or an inert gas into the heating furnace; a step of heating the heating furnace by the heating means so that the high temperature uniform-heat region becomes a predetermined temperature; a step of moving the wafer holder downward from the low temperature region to the high temperature uniform-heat region, to raise temperature of the wafer holder and the semiconductor wafers to the predetermined temperature; a step of moving the wafer holder and the semiconductor wafers downward, to dip the wafer holder and the semiconductor wafers into the source accommodated in a source sump, in which a solute containing a semiconductor material used for epitaxial growth is dissolved in a solvent containing metal; a step of lowering temperature of the high temperature uniform-heat region for epitaxial growth on the semiconductor wafers; and a step of pulling the wafer holder out of the source to complete the epitaxial growth.

BRIEF DESCRIPTION OF THE DRAWINGS

FIG. 6(a) is a perspective view showing a wafer holder construction used for a fourth embodiment of the epitaxial growth method according to the present invention;

FIG. 6(b) is a longitudinal cross-sectional view showing the same wafer holder, taken along the line C—C in FIG. 6(a);

FIGS. 12(a) and 12(b) are longitudinal cross-sectional views showing the wafer structure obtained by the same epitaxial growth method according to the present invention;

FIGS. 13(a) and 13(b) are longitudinal cross-sectional views showing the source sump structure used for the same epitaxial growth apparatus according to the present invention;

FIG. 17(a) and 17(b) are longitudinal cross-sectional views showing another prior art dipping epitaxial growth method; and FIG. 18 is a longitudinal cross-sectional view showing the positional relationship between the wafers and the source in the prior art epitaxial growth method.

DETAILED DESCRIPTION OF THE PREFERRED EMBODIMENTS

Some embodiments of the semiconductor liquid phase epitaxial growth method and apparatus according to the present invention will be described hereinbelow with reference to the attached drawings.

(1) 1st Embodiment of Wafer Holder

Figure 1:
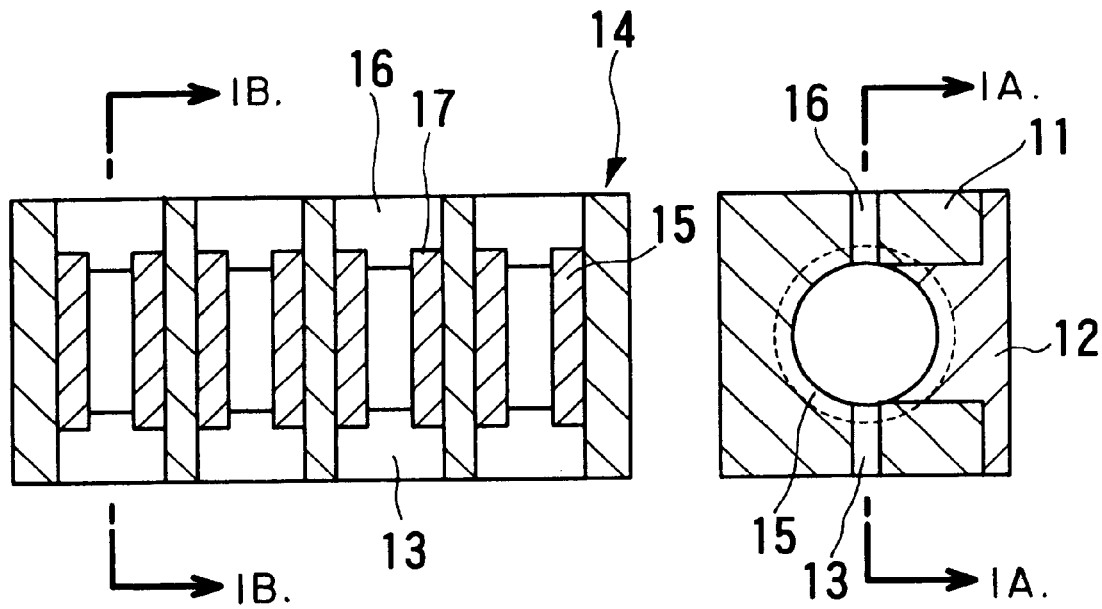
FIG. 1(a) is a longitudinal cross-sectional view showing a wafer holder construction used for a first embodiment of the epitaxial growth method according to the present invention, taken along a line B—B shown in FIG. 1(b)
FIG. 1(b) is a cross-sectional view showing the same wafer holder construction, taken along a line A—A shown in FIG. 1(a)
FIG. 1(c) is a bottom view showing the same wafer holder shown in FIGS. 1(a) and 1(b)
Figure 1:
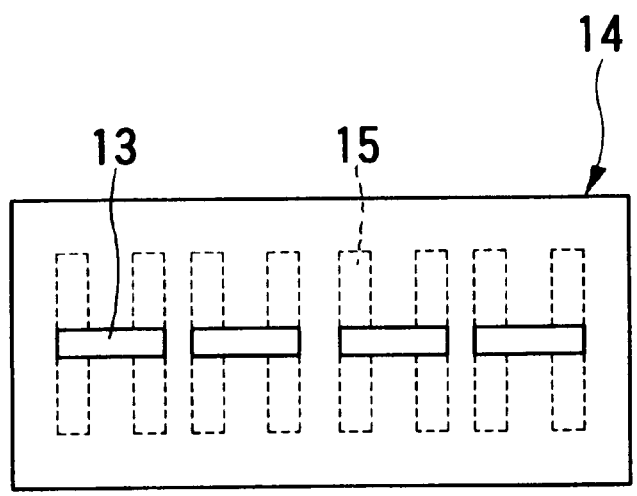

FIG. 1(a) is a longitudinal cross-sectional view showing a wafer holder construction used for the first embodiment according to the present invention, taken along a line B—B shown in FIG. 1(b); FIG. 1(b) is cross-sectional view showing the same wafer holder construction, taken along a line A—A shown in FIG. 1(a); and FIG. 1(c) is a bottom view showing the same wafer holder shown in FIGS. 1(a) and 1(b).

In the wafer holder shown in FIG. 1(a), the structure is such that a plurality of wafers 15 are held alternately reverse side and right side (i.e., back to back) in the vertical or oblique direction; the reverse sides of the wafers 15 are separated from each other by a wafer holder 14, respectively; and the right sides of the wafers 15 are held so as to be opposed with a space between the two. Further, as shown in FIG. 1(b), the wafer 15 is put in a U-shaped pocket formed in a wafer holder body 11, and then fixed to the pocket by use of a cover 12. The shapes of the U-shaped pocket and the cover 12 are fitted to the outer circumferential shape of the wafer, so that the periphery of the wafer 15 is covered with the pocket and the cover 12. When seen in the state where placed in a furnace, the cover 12 is inserted in the horizontal direction. Further, as shown in FIGS. 1(b) and 1(c), the wafer holder is formed, at the bottom portion thereof, with an inlet and outlet port 13 for injecting and exhausting epitaxial growth source into and from the space between the right surfaces of the two wafers 15. Further, slits 16 formed on the upper side of the wafer holder are gas drainages effective when the source is injected or exhausted.

The wafer holder according to the present invention is formed on condition that the epitaxial growth ends by pulling the wafer holder from the source in the case of the dipping method, and by exhausting the source from the epitaxial chamber in the case of the injection method. Therefore, the wafers are held in the vertical or oblique direction in order that the source can quickly flow away from the wafers. Further, the outlet port is formed at the lowermost portion of the wafer.

The structure such that the two wafers 15 are held back to back via the wafer holder 14 is one of the features of the first embodiment. Since the wafer holder 14 can be brought into tight contact with the reverse side of the wafer 15, it is possible to solve the problem often involved in the prior art dipping method in that the epitaxial growth is formed on the reverse side of the wafer. Further, since a plurality of the wafers 15 can be held by and accommodated in the wafer holder 14 at the same time, it is possible to increase the number of the wafers on each of which the epitaxial growth layer can be formed, so that the productivity in the epitaxial growth process can be improved.

The structure such that the two epitaxial growth surfaces of the wafers 15 are held so as to be opposed to each other with a constant space between both is one of the features of the first embodiment. Since the epitaxial growth surfaces are opposed to each other, it is possible to prevent polycrystal from being deposited on the two opposing surfaces, so that an epitaxial growth layer of uniform thickness and uniform surface can be obtained.

The prevention of polycrystal deposition and the easiness of source exhaust by this embodiment are particularly effective when a multi (two or more) epitaxial growth layer is formed by the injection method and the dipping method.

The space between the two opposing surfaces, that is, between the two epitaxial growth surfaces (i.e., the thickness of the source on the wafers) is an important factor for controlling the film thickness of the epitaxial growth layer. This is because since the epitaxial growth layer can be formed when the solute in the source existing on the wafer surface is diffused to the wafer surface and then deposited, the thickness of the epitaxial growth layer is substantially proportional to the thickness of the source on the wafer surface. Here, although it is preferable to minimize the source thickness in order to use the source effectively without any waste, when the space between the two opposing surfaces of the wafers is decided below a constant value, it is impossible to control the start and end of the epitaxial growth. This is because when the wafers are put into the source, the source cannot flow along the wafer surfaces or because when the wafers are pulled from the source, the source cannot flow away from the wafer surfaces. Therefore, when the two epitaxial growth surfaces of the two wafers are opposed to each other, the necessary minimum source thickness can be doubled, with the result that it is possible to allow the source to easily flow along and away from the wafer surfaces.

The practical space between the two opposing wafers is 0.3 mm or more. However, the preferable value is 0.5 mm or more. When less than 0.2 mm, there exists a possibility that the source cannot flow into between the two wafers. Further, when less than 0.4 mm, when the wafers are pulled out of the source, there exists the case where the source remains between the two wafers due to the surface tension of the source.

Further, when the wafer interval is too large, since the solute of the source existing between the two opposing wafers cannot reach the wafers during the epitaxial growth, the solute is deposited in the source. To prevent the solute form being deposited in the source, it is preferable to decide the wafer interval less than 5 mm.

Since the diffusion of solute is dependent upon the time during which the source is kept over-saturated, that is, the reciprocal number of the temperature fall rate, the wafer space in which the deposition occurs is also dependent upon the temperature fall rate. The following formula (1) has been obtained empirically. Therefore, it is desirable that the wafer space is set within a range decided by this formula (1).

$$\text{Wafer space (mm)} \leq 3.1 \times (1/\text{temp fall rate (Celsius/min)})^{1/2} \quad (1)$$

The wafer 15 is accommodated at a stepped portion 17 formed in the holder body 11. The similar stepped portion is formed in the surface of the cover 12. The wafer 15 is accommodated on the large-diameter side of the stepped portion. The larger-diameter of the stepped portion is determined larger than that of the wafer under due consideration of the thermal expansion of the wafer. However, it is preferable to determine the diameter of the stepped portion 17 to be smaller than that of the wafer, on the side opposite to the reverse surface of the wafer 15, in order to cover the edge of the wafer 15. This is because when a floating force is applied to the wafer in the source or when the boat for accommodating the wafer holder is moved, it is possible to prevent the wafer from being dislocated from the predetermined position.

However, when the diameter of this smaller-diameter portion is excessively reduced, since the wafer area for the epitaxial growth is reduced, it is preferable to increase the diameter of this wafer-fixing portion of the stepped portion 17 of the holder body 11.

In general, the peripheral portion of the wafer is chamfered. Therefore, the crystal orientation of the epitaxial growth is different between the periphery and the surface of the wafer. In the peripheral portion of the wafer, an abnormal growth (e.g., the growth of polycrystal semiconductor) tends to occur. Therefore, after the epitaxial growth, the wafer periphery is removed mechanically, or the semiconductor elements formed at the wafer periphery are removed, without use of the wafer periphery substantially. Although being different according to the sort or the thickness of the epitaxial growth layer, this non-used beveled region of the wafer is less than 1 mm from the outermost circumference of the wafer. Therefore, in general, the wafer is removed by 2 mm from the outermost circumference of the wafer for safety. Therefore, when a contact point between the wafer and the wafer holder is limited to a range less than 2 mm radially inward from the outermost circumference of the wafer, it is possible to eliminate the practical loss caused by the abnormal growth due to contact between the wafer and the wafer holder. In other words, it is preferable to set the diameter of the stepped portion 17 on the right side of the wafer to a value obtained by subtracting 4 mm from the diameter of the wafer.

Or else, when the epitaxial growth is made without contacting the chamfered portion of the wafer with the source, the abnormal growth will not occur at the edge of the wafer. In this case, therefore, it is preferable to form the stepped portion 17 in such a way as to cover the chamfered portion of the wafer.

Further, in the dimensional design of the wafer holder (including the diameter design), it is necessary to take into account differences in thermal expansion between the wafer and the wafer holder.

The structure such that the source is isolated from the periphery and the side surface of the wafer by covering the wafer periphery and further that the source is limited to the smallest possible amount are also the features of this embodiment.

Here, it is possible to uniformalize the film thickness of the epitaxial growth layer, when the gap at the wafer periphery, that is, the distance between the wafer edge and the wafer holder or the cover, is minimized. On the other hand, when the wafer gap at the periphery thereof is large enough beyond a distance at which the solute (i.e., the epitaxial growth raw material) can diffuse in the source, the film thickness of the epitaxial growth layer tends to be non-uniform. As already explained, the diffusion distance is proportional to the temperature fall rate during the epitaxial growth. Therefore, when the wafers are arranged on both the sides, the distance obtained empirically is a half of that obtained in accordance with the formula (1). That is, when the temperature fall rate is 0.1 Celsius/min, the distance is 4.9 mm; when the temperature fall rate is 0.4 Celsius/min, the distance is 2.5 mm; and when the temperature fall rate is 1 Celsius/min, the distance is 1.6 mm. Therefore, it is preferable that the interval between the wafer edge and the wafer holder is determined less than 4.9 mm.

Further, in the same way as with the case of the wafer intervals, when the gap between the wafer edge and the wafer holder is less than 0.5 mm, the source will not easily enter the wafer edge. However, it is preferable to provide a margin of less than 0.5 mm for the wafer holder, in order to absorb the thermal expansion difference between the wafer and the wafer holder.

The point that the inlet and outlet port of the pocket is formed in the horizontal direction of the wafer holder and further that the wafers and the covers can be inserted in the horizontal direction, when seen in the state where the wafer holder is placed in the furnace, are also the features of the wafer holder of this embodiment. Here, two upward and downward forces are applied to the wafer accommodated in the wafer holder. One is a weight of the wafer itself applied to the wafer downward, and the other is a buoyant force generated in the epitaxial growth source of a large specific gravity and applied to the wafer upward. Therefore, when the wafers are inserted in the horizontal direction, it is possible to limit the vertical movement of the wafer securely by use of the holder body.

(2) 2nd Embodiment of Wafer Holder

Figures 2A, 2B:
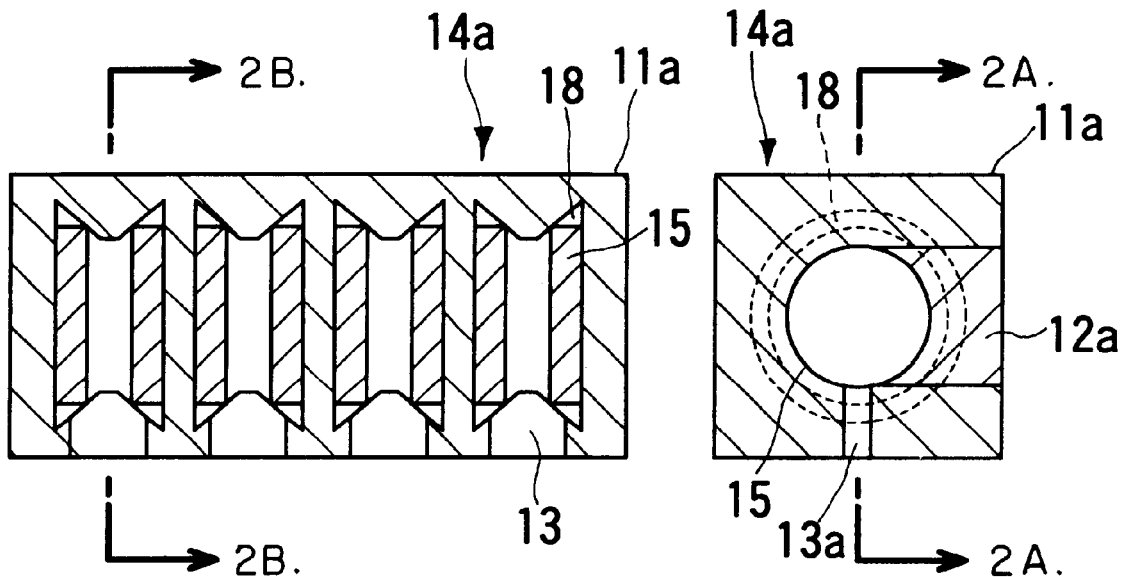
FIG. 2(a) is a longitudinal cross-sectional view showing a wafer holder construction used for a second embodiment of the epitaxial growth method according to the present invention, taken along a line B—B shown in FIG. 2(b)
FIG. 2(b) is a cross-sectional view showing the same wafer holder, taken along a line A—A shown in FIG. 2(a)
Figure 2C:
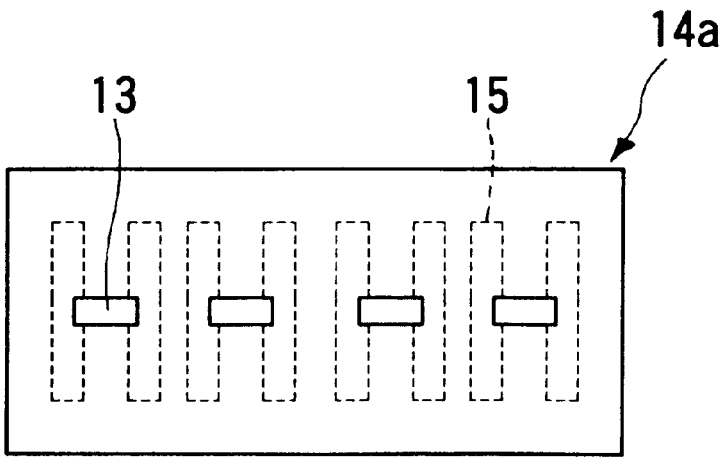
FIG. 2(c) is a bottom view showing the same wafer holder shown in FIGS. 2(a) and 2(b)

FIG. 2(a) is a longitudinal cross-sectional view showing a wafer holder used for the second embodiment of the present invention, taken along a line B—B shown in FIG. 2(b); FIG. 2(b) is a cross-sectional view showing the same wafer holder, taken along a line A—A shown in FIG. 2(a); and FIG. 2(c) is a bottom view showing the same wafer holder shown in FIGS. 2(a) and 2(b).

The wafer holder of this second embodiment is basically the same in structure and function as with the case of the first embodiment shown in FIGS. 1(a) to 1(c), except for the following point. Therefore, the same reference numerals have been retained for the similar parts or elements which have the same functions.

In this second embodiment, the wafer 15 is accommodated in a tapered portion 18 within a space of the holder body 11a (not in the stepped portion). When the stepped portion is formed in the holder body 11, the wafer holder must be prepared for a thickness of each of the wafers. In the case of the tapered portion 18, however, it is possible to accommodate the wafers of a different thickness. In addition, before the start of the epitaxial growth, the wafer 15 is urged downward by its weight. During the epitaxial growth, however, the wafer is urged upward into tight contact with the wafer holder 14a by the buoyant force of the source. When the wafer holder 14a is manufactured by use of a material (e.g., carbon) of high thermal conductivity, since the intra-surface temperature distribution of the wafer 15 brought into tight contact with the wafer holder 14a can be uniformalized, it is possible to obtain a uniform epitaxial growth.

For the same reason as with the case of the first embodiment, it is preferable that the minimum diameter of the taper portion 18 is smaller than that of the wafer but larger than a value obtained by subtracting 4 mm from the wafer diameter; that is, larger than the diameter of the non-chamfered portion of the wafer.

In the second embodiment, the gas drainages are not formed. However, since gas can flow through the gap formed between the holder body 11a and the cover 12a, it is possible to flow the source into or out of the holder body by controlling the inject and exhaust speed of the source.

In the same way as with the case of the first embodiment, the source inlet and outlet port 13a of this embodiment is not opened to the reverse surface of the wafer 15, but opened to a midway position of the wafer 15, when seen in the cross-sectional view shown in FIG. 2(c), in such a way as that a height difference exists relative to the wafer holder 14a with which the reverse surface of the wafer is brought into tight contact.

Figure 3A:
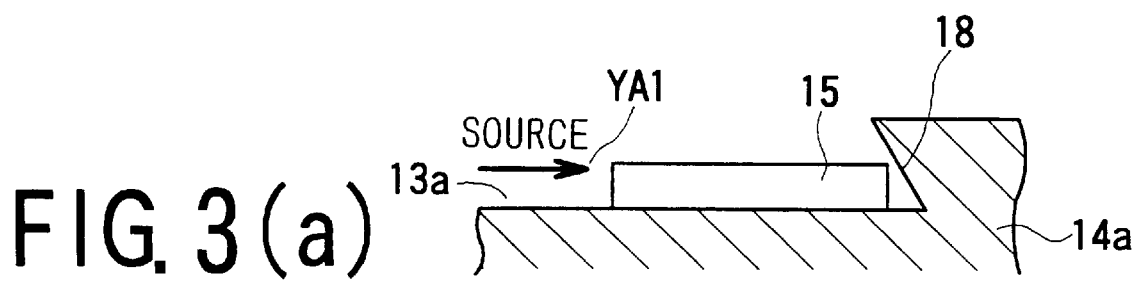
FIGS. 3(a), 3(b) and 3(c) are longitudinal cross-sectional views showing the mutual positional relationship between a wafer and an inlet and outlet port of the same wafer holder, respectively.
Figure 3B:
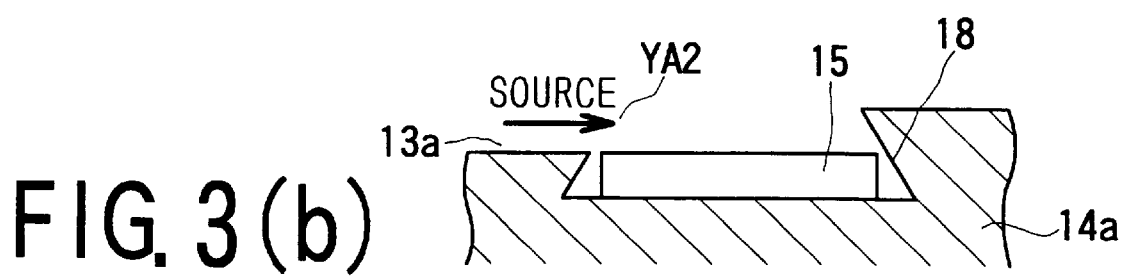
Figure 3C:
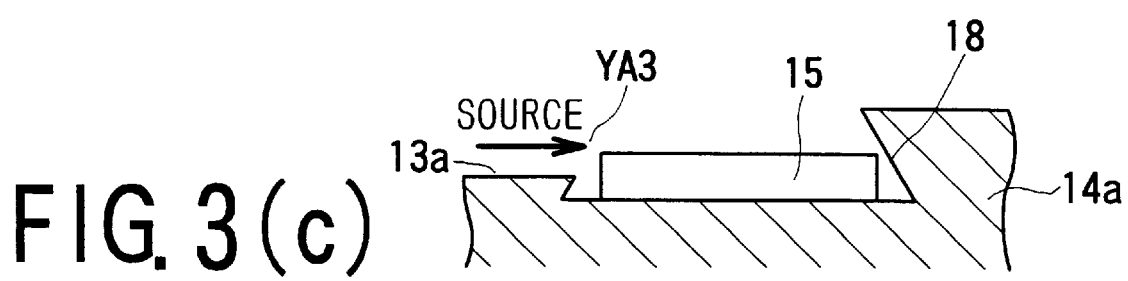

FIGS. 3(a) to 3(c) show the positional relationship between the wafer holder 14a, the wafer 15 and the inlet and outlet port 13a. FIG. 3(a) shows a structure in which the wafer holder 14a and the inlet and outlet port 13a are set to the same level, in the same way as in the first embodiment. In this case, since the injected source is brought into contact with the side surface of the wafer 15, there exists a possibility that the source enters the reverse surface of the wafer. Further, although it is important to limit the amount of the source injected into the side surface of the wafer 15 or not to inject the source thereinto, in the case of the structure as shown in FIG. 3(a), since the source enters the edge of the wafer at the inlet and outlet port 13a, the solute is diffused from the source existing at the inlet and outlet port 13a. Therefore, the film thickness of the epitaxial growth layer increases near the inlet and outlet port 13a and at the edge of the wafer 15.

FIG. 3(b) shows a structure in which the height difference of the inlet and outlet port 13a is set to a value wafer thickness higher than the wafer holder 14a. In this structure, the wafer 15 can be accommodated within the height difference between both. Since being injected to the right surface of the wafer, the source will not flow to the reverse side of the wafer. Therefore, the film thickness of the epitaxial growth is uniform near the edge of the wafer 15 and at the inlet and outlet port 13a.

FIG. 3(c) shows a structure in which the height difference of the inlet and outlet port 13a is set to a value half of the wafer thickness higher than the wafer holder 14a. In this structure, although the height difference corresponds to a half of the wafer thickness, since the edge of the wafer is chamfered, the source will not flow to the reverse surface of the wafer. However, the effect of uniformalizing the film thickness of the epitaxial growth at the edge of the wafer is inferior to the structure as shown in FIG. 3(b). On the other hand, however, since the dimension of the inlet and outlet port 13a can be widened, the source can be injected or exhausted more easily to and from the wafer holder 14a.

As described above, when the reverse surfaces of the wafers are directly brought into contact with each other without use of any wafer holder 14a, it is essential to form a height difference at the inlet and outlet port in order to prevent the source from being brought into contact with the side surfaces of the wafers 15. This is because when the epitaxial growth is made by bringing the source into contact with the side surfaces of the wafers in the state where the reverse surfaces of the wafers are in tight contact with each other, there exists a case where the two wafers are joined with each other due to the epitaxial growth at the side surfaces of the wafers.

(3) 3rd Embodiment of Wafer Holder

Figure 4:
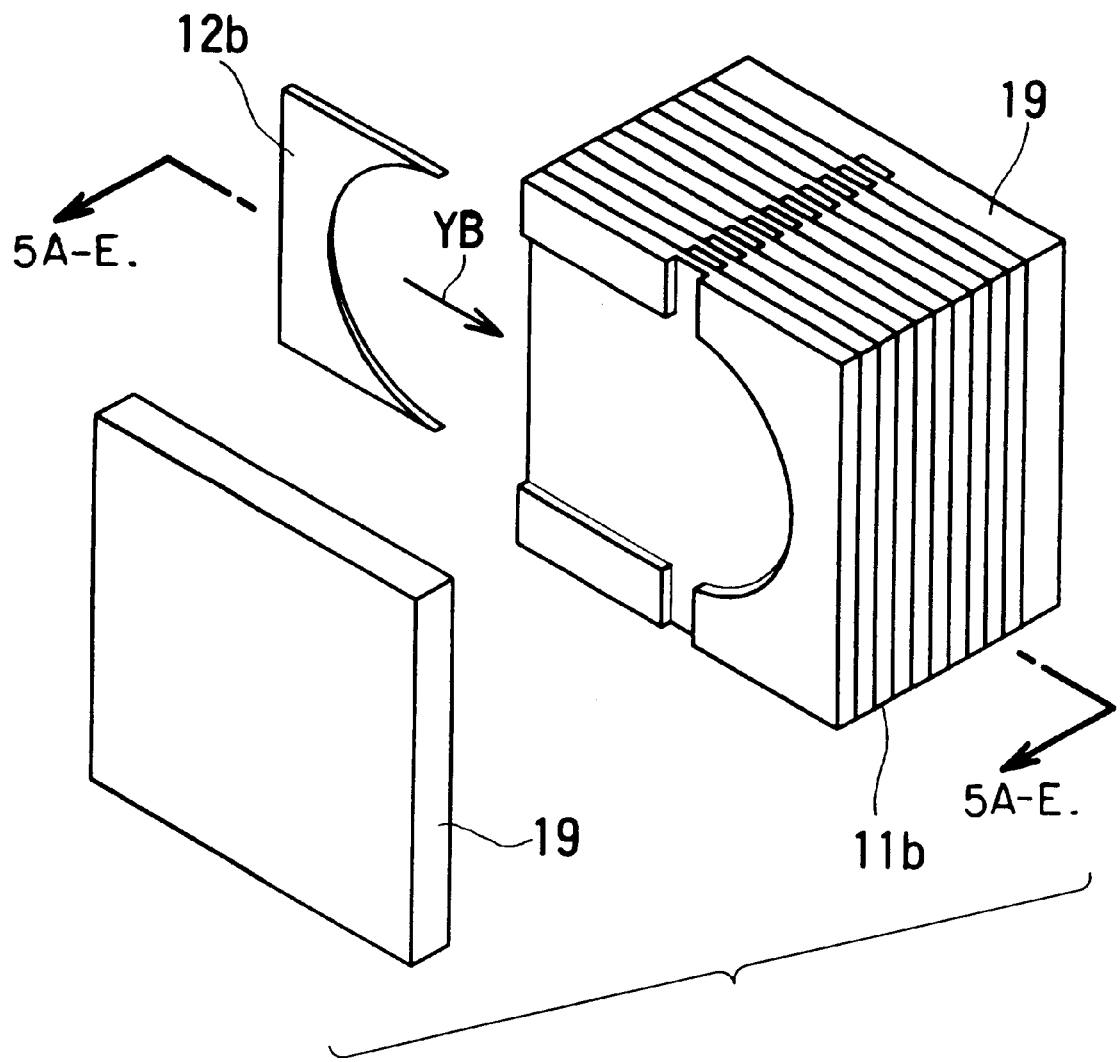
FIG. 4 is a perspective view showing a wafer holder construction used for a third embodiment of the epitaxial growth method according to the present invention.

FIGS. 4 and 5 show the third embodiment of the wafer holder according to the present invention. FIG. 4 shows the structure in which ten sets of holder assemblies each composed of a holder plate 11b and an insertion cover 12b are assembled together. Further, in FIG. 4, a push plate 19 is provided on both sides of the holder plate assemblies, respectively.

FIGS. 15(a) to 15(e) show the cross-sectional structures of the holder plates 11b and the covers 12b and further the procedure of accommodating the wafers 15 in the holder assemblies.

The holder plate 11b is formed with two symmetrical tapered portions 18b for accommodating two wafers 15 on one side of a wafer holder body 14b. When the diameter of the wafer is 76.0 mm, the minimum diameter of the taper portion 18b is 75.2 mm, the maximum diameter thereof is 77.0 mm, and the taper angle is set to 45 degrees. Further, these dimensions are set in such a way that when the wafer 15 with a thickness of 0.35 mm is used, a space between the two opposing wafers is set to 2 mm. The material of the wafer holder body 14b is high purity carbon.

Figure 5A:
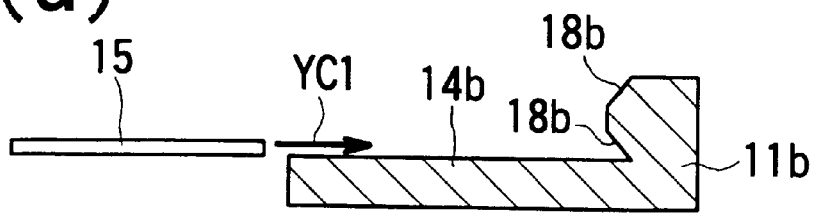
FIGS. 5(a) to 5(e) are longitudinal cross-sectional view showing a procedure of accommodating wafers by use of the same wafer holder shown in FIG. 4.
Figure 5B:
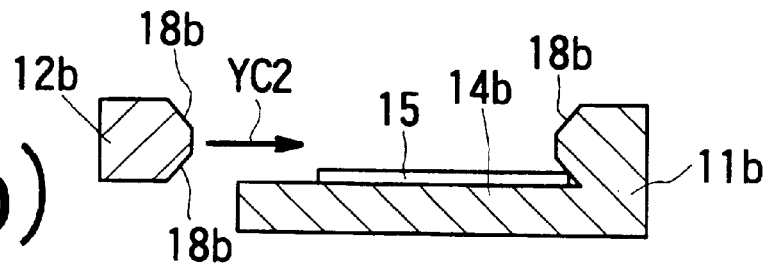
Figure 5C:
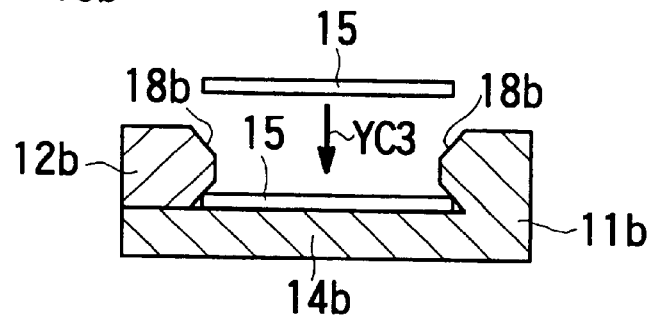
Figure 5D:
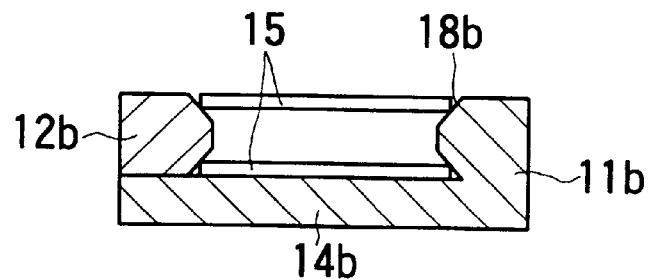
Figure 5E:
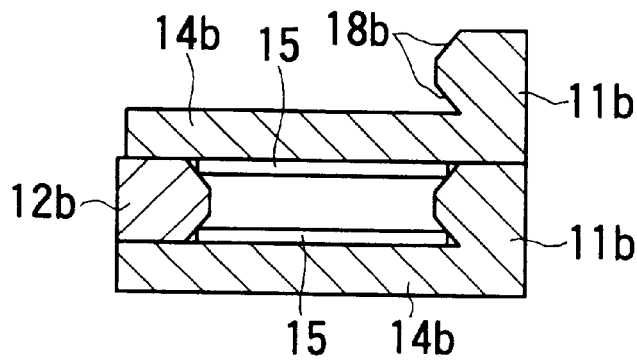

As shown in FIG. 5(a), the wafer 15 is inserted into the taper portion 18b formed at a U-shaped groove portion of the holder plate 11b placed in the horizontal direction in such a way that the right surface of the wafer can be exposed. Further, as shown in FIG. 5(b), the inserted wafer 15 is fixed by the cover 12b. The cover 12b is formed with two similar symmetrical taper portions 18b. As shown in FIGS. 5(c) and 5(d), the second wafer 15 is fitted to the taper portion 18b from above. Further, as shown in FIG. 5(e), another holder plate 11b is stacked thereupon, and finally the push plate 19 is stacked. Therefore, when the entire assembly is stood, the wafers 15 can be accommodated in the holder assemblies in such a way that the two right surfaces thereof are opposed to each other but the two reverse surfaces thereof are arranged back to back in contact with the wafer holder body 14b, respectively.

Although not shown, the stacked wafer holder bodies 14b are fixed to each other by forming at least one through hole in each wafer holder body 14b at a position other than the groove portion and by passing a pin or a screw through the formed holes. Or else, the wafer holder bodies 14b can be housed in a casing large enough to accommodate a plurality of the wafer holder bodies 14b.

Here, when the wafers are inserted after the holder plates 11b have been all stacked, since the groove portions are located at deep position and further the groove depth is thin, the wafers are easily rotated when accommodated. Therefore, it is difficult to align the crystal orientation constant, that is, to obtain a wafer orientation flat. In this embodiment, however, since the wafer is accommodated whenever the holder plates are stacked upon each other, it is possible to adjust the wafer orientation easily.

(4) 4th Embodiment of Wafer Holder

FIG. 6(a) is a perspective view showing the entire wafer holder construction used for the fourth embodiment according to the present invention; and FIG. 6(b) is a longitudinal cross-sectional view taken along a line C—C shown in FIG. 6(a).

In this embodiment, a holder plate 11c is formed with a semicircular groove portion having two symmetrical taper portions 18c at the peripheral portion thereof, except the opening surface side of a circular holder supporting plate 14c at the central portion of the holder plate 11c. Further, a cover 12c, is formed with the similar groove portion having two symmetrical taper portions 18c. The cover 12c can be fixed to the holder plate 11c by fitting the holder supporting plate 14c of the holder plate 11c into the groove formed between the two taper portions 18b. Further, an inlet and outlet port 13c and a gas drainage groove 16c both provided in the holder plate 11c are formed with a height difference corresponding to a wafer thickness relative to the holder supporting plate 14c, as shown in FIG. 3(b).

Here, the reason why the holder supporting plate 14c is circular in shape is that the orientation of the wafer 15 can be adjusted easily when accommodated in the holder plate 11c.

In the wafer holder of this embodiment, after the two wafers 15 are accommodated in the holder plate 11c, the cover 12c is attached to the holder supporting plate 14c. Further, a plurality of the assembled sets are stacked upon each other or arranged in a casing together. Or else, after only a plurality of holder plates 11c have been stacked upon each other, the wafers 15 can be accommodated in each holder plate 11c and then each cover 12c can be attached thereto. In this case, since it is unnecessary to cover each holder plate 11c with each cover 12c correspondingly, a single cover can be used to cover a plurality of the holder plates together.

(5) 5th Embodiment of Epitaxial Growth Method and Apparatus

The first to fourth embodiments of the wafer holder according to the present invention as described above can be used effectively for the epitaxial growth method and apparatus according to the present invention. The boat used for the liquid phase epitaxial growth of source injection type (which is used within a horizontal furnace) and the liquid phase epitaxial growth method using the same boat will be described hereinbelow. Further, the dipping method and apparatus using a vertical furnace will be also described hereinbelow. In these methods, however, it is possible to use the other wafer holders, without being limited to only the wafer holders of the above-mentioned embodiments.

FIGS. 7(a) to 7(j) show the process of the fifth embodiment of the epitaxial growth method according to the present invention, in which two epitaxial growth layers of GaAs and AlGaAs are formed by use of the above-mentioned boat.

Figure 7:
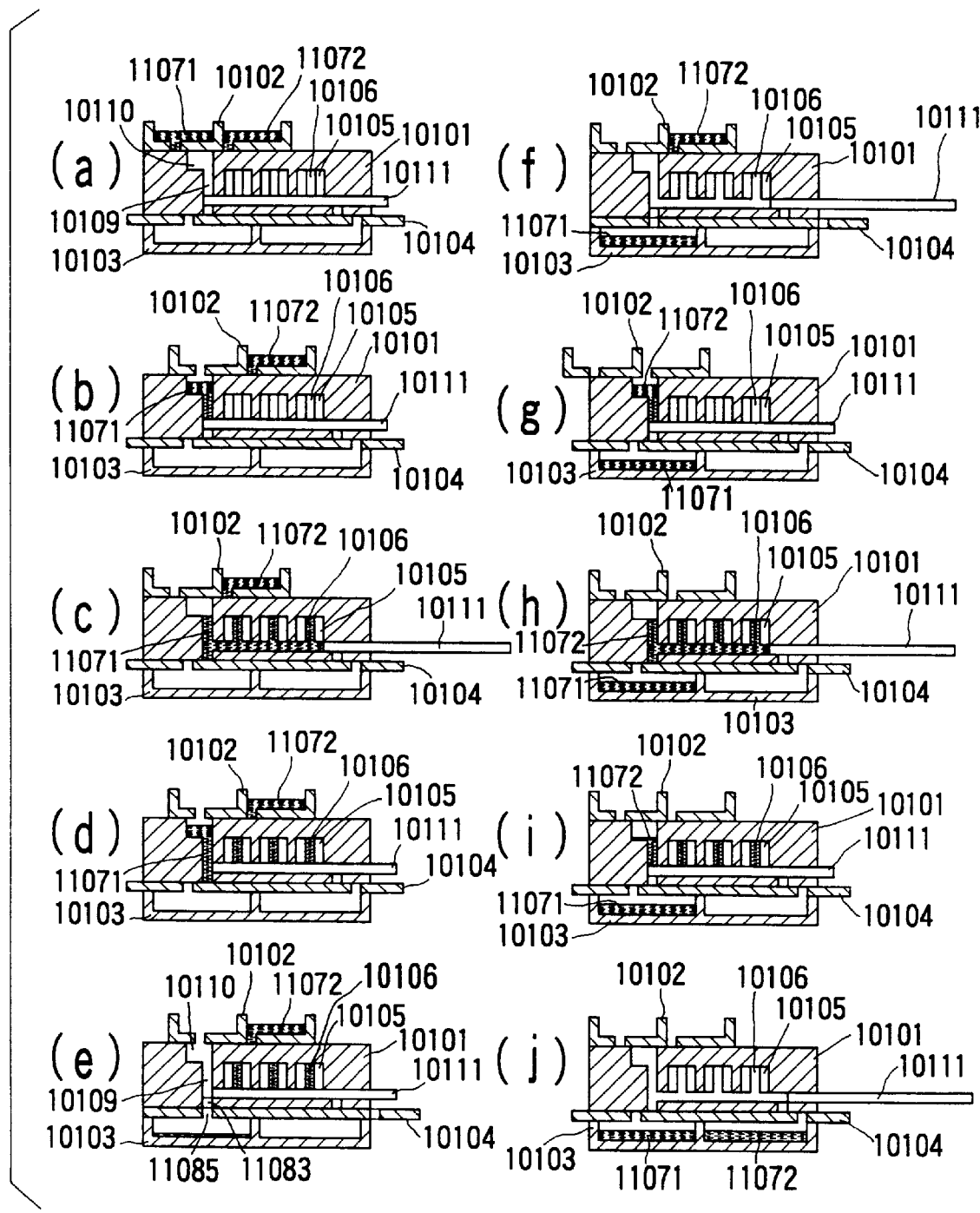
FIGS. 7(a) to 7(j) are longitudinal cross-sectional views showing a fifth embodiment of the epitaxial growth method and apparatus according to the present invention, for assistance in explaining the epitaxial growth procedure.

In FIG. 7(a), a wafer 10105 is placed in a furnace before the epitaxial growth. In the drawing, the furnace and the furnace tubes are all not shown for brevity.

The essential portion of the boat is composed of a body 10101, a source sump 10102, an exhaust source sump 10103, and a partition 10104 disposed between the body 10101 and the exhaust source sump 10103. Further, in the body 10101, an epitaxial growth chamber 10106 for accommodating wafers 10105 for epitaxial growth is formed. The body 10101 is formed with a front chamber 10110 which is connected to the epitaxial growth chamber 10106 through a source passage 10109. Further, a control rod 10111 is inserted to the source passage 10109 in the horizontal direction.

The source sump 10102, the control rod 10111 and the partition 10104 are all movable in the horizontal direction by use of a quartz rod (not shown) inserted into the furnace from the outside during the epitaxial growth process.

As shown in FIG. 7(a), before the epitaxial growth, the wafers 10105 are held in the epitaxial growth chamber 10106. In this embodiment, the way of holding the wafers and the wafer holders are not limited particularly. In FIG. 7(a), two wafers are held in the vertical direction at intervals in such a way that the epitaxial growth surfaces thereof are opposed to each other. Further, it is preferable to cover the peripheries of all the wafers by use of the wafer holder, except a space for supplying a minimum possible amount of the source required for the epitaxial growth.

Into the source sump 10102, a raw material of the epitaxial growth source is put. In this embodiment, the source sump 10102 is partitioned to the right side and the left sides. A first source 11071 for GaAs epitaxial growth is put into the left side source sump, and a second source 11072 for AlGaAs epitaxial growth is put into the right side source sump. In the first source raw material, metal Ga is 100; poly GaAs is 15; and dopant Si is 0.3, for instance in weight ratio. Further, the second source raw material, metal Ga is 100; poly GaAs is 5.6; Al metal is 0.1; and dopant Zn is 0.06, for instance in weight ratio.

Under these conditions, the boat is mounted on the furnace, and then heated up to 950 Celsius in hydrogen atmosphere to dissolve the source raw material. Further, after about one hour, the furnace temperature is lowered down to 920 Celsius and then the source injection is started for the epitaxial growth.

First, as shown in FIG. 7(b), the source sump 10102 is slid to the right side to introduce the first source 11071 into the front chamber 10110.

When the front chamber does not exist as with the case of the prior art method, the source flows directly from the source sump to the epitaxial chamber. In the prior art case, in case the source composition is not uniform in the source sump, for instance as when the source composition is different between the start and end of the source injection, the source is not uniform. In this embodiment, however, since the front chamber 10110 is formed, the source can be mixed when flowing into the front chamber 10110, so that the source composition can be uniformalized. Further, when a GaAs lump is placed in the front chamber 10110, even if the dissolved source is not sufficiently saturated in the source sump, it is possible to saturate the source in the front chamber 10110.

Further, as shown in FIG. 7(c), the control rod 10111 is slid to the right side, to inject the source into the epitaxial growth chamber 10106 through the source passage 10109, so that the source is brought into contact with the wafer 10105.

Further, as shown in FIG. 7(d), the control rod 10111 is returned to the left side to such a position at which both the source passage 10109 is not shut off. Under these conditions, the epitaxial growth chamber 10106 is kept isolated from the source passage 10109.

Further, as shown in FIG. 7(e), the partition 10104 is slid to the right side to match a source outlet port 11083 formed in the body 10101 with a source outlet port 11085 formed in the partition 10104 to exhaust the source remaining in the front chamber 10110 and/or the source passage 10109 into a left side chamber of an exhaust source sump 10103.

Under these conditions as shown in FIG. 7(e), the furnace temperature is lowered for GaAs epitaxial growth. Here, the temperature fall rate is 0.8 Celsius/min, for instance.

In this embodiment, during the epitaxial growth, since the epitaxial growth chamber 10106 is isolated from the source passage and thereby the source required for the epitaxial growth exists only on the epitaxial growth surface of the wafers, it is possible to prevent the poly GaAs from being deposited and adhered onto the wall surface of the epitaxial growth chamber 10106. Further, since the second source route of the source passage 10109 and/or the front chamber 10110 are shut off by the control rod or since the excessive source has been already exhausted, it is possible to prevent poly GaAs from being deposited on the wall surface. Therefore, when the first source is exhausted, it is possible to eliminate the deposited and adhered substance or the remaining source related thereto and further to prevent an excessive source from being mixed with the source required for the epitaxial growth.

When the furnace temperature has been lowered down to 830 Celsius, for instance, the furnace temperature is kept constant (without lowering the furnace temperature), and then the epitaxial growth is stopped. Further, as shown in FIG. 7(f), the control rod 10111 is slid to the right side, to exhaust the first source into the left side of the exhaust source sump 10103.

Further, as shown in FIGS. 7(g) to 7(i), the second source is injected into the front chamber 10110. Here, excepting the sliding movement of the source sump to the left side, the procedure is the same as with the case of the first source injection procedure as shown in FIGS. 7(b) to 7(d).

After injection, in the state as shown in FIG. 7(i), the furnace temperature is lowered again, to grow an AlGaAs layer on the GaAs epitaxial growth layer. The furnace temperature fall rate is 0.8 Celsius/min, for instance.

When the furnace temperature reaches 700 Celsius for instance, as shown in FIG. 7(j), the control rod 10111 is slid to the right side to exhaust the second source into the right side of the exhaust source sump 10103, so that the epitaxial growth process ends.

In this embodiment, since the first source 11071 used for the GaAs growth and the second source 11072 used for the AlGaAs growth are both exhausted into the partitioned portions of the exhaust source sump, it is possible to collect the respective exhausted sources and to reuse the collected sources by adding necessary raw materials for the succeeding epitaxial growth.

Figure 14:
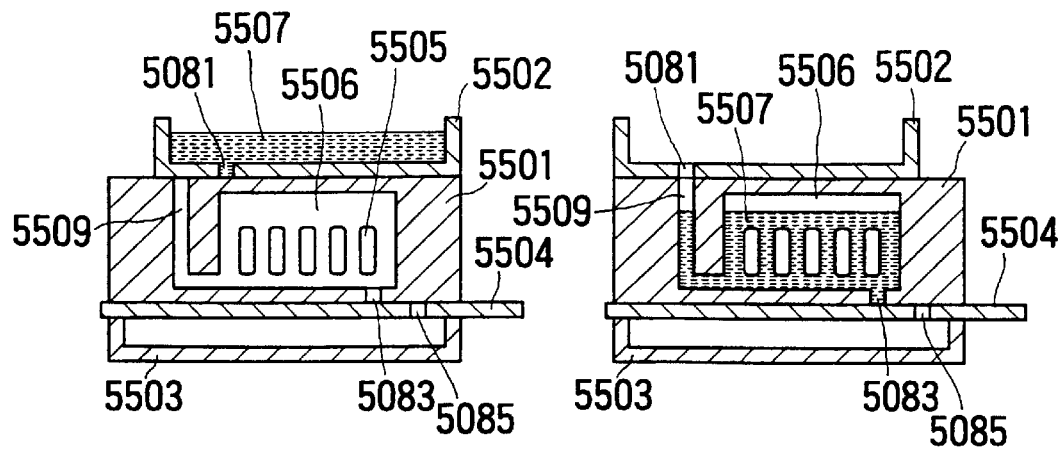
FIGS. 14(a) to 14(c) are longitudinal cross-sectional views showing the structure of a prior art epitaxial growth apparatus.
Figure 14:
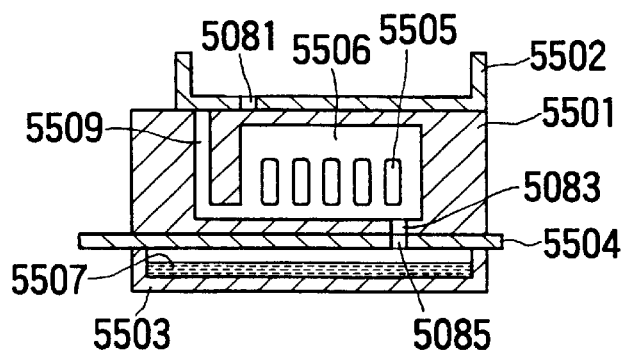
Figure 15:
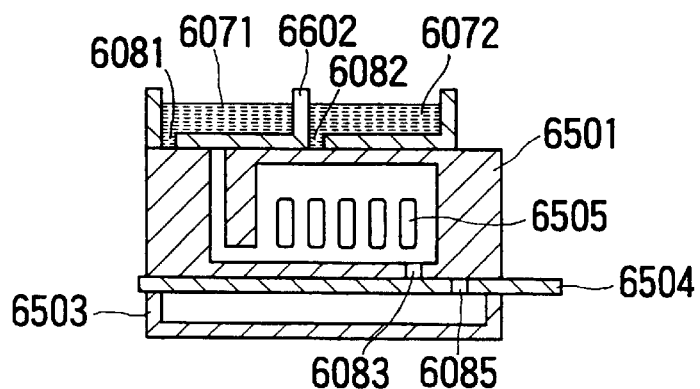
FIG. 15 is a longitudinal cross-sectional view showing the structure of another prior art epitaxial growth apparatus.
Figures 16A, 16B:
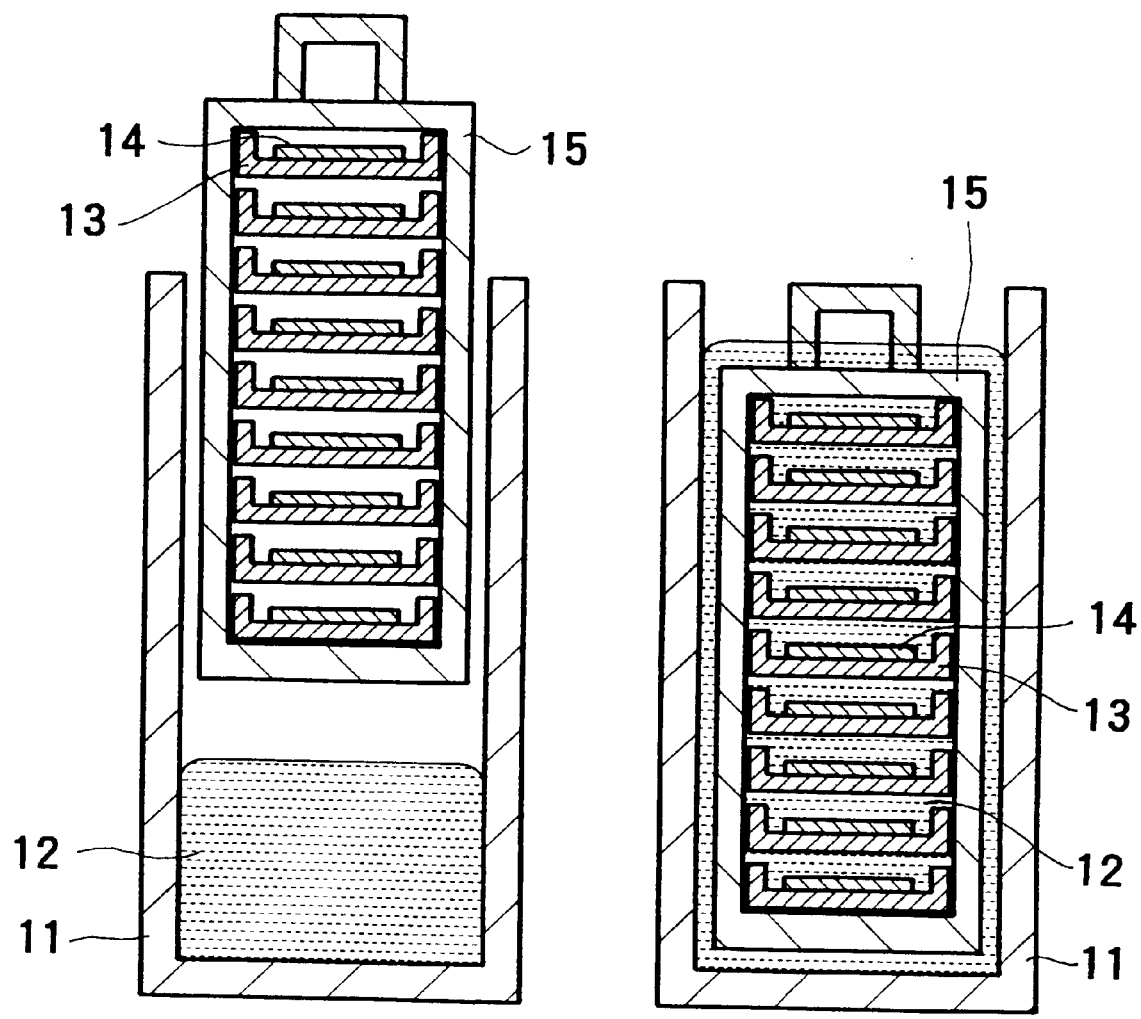
FIGS. 16(a) to 16(b) are longitudinal cross-sectional views showing a prior art dipping epitaxial growth method.

Here, the comparison results between the epitaxial growth method according to the present invention as shown in FIGS. 7(a) to 7(j) and the prior art epitaxial growth method as shown in FIGS. 14(a) to 14(c) will be described hereinbelow.

The wafers on which the epitaxial growth layers have been formed at the nearest positions of the source inject ports were cleavaged in the longitudinal direction of the wafers, respectively, and the distributions of the wafer thicknesses (except the epitaxial growth layers) were examined.

The wafers each having a thickness of 350"10 $\mu$m were used in both the fifth embodiment method and the prior art method. In the case of the prior art method, the thickness of the wafer was reduced by 42 $\mu$m (12%) at the lower side edge, as compared with the central portion thereof. The lower side edge of the wafer is the place with which the source is first brought into contact. The source injected first tends to be non-saturated at the bottom portion of the source sump. Therefore, it is considered that since the non-saturated portion of the source was first injected, the wafer was etched and therefore thinned by the source injection. In contrast with this, in the epitaxial growth method according to the present invention, a large difference in wafer thickness did not exist between the central portion and the edge portion, within the tolerance of the wafer thickness of 2 $\mu$m.

Further, in order to examine the uniformity of the dopant, five LEDs were manufactured by use of the five wafers, and then the wavelengths of the generated light were compared. Here, the GaAs LED having a Si dopant generates light between the impurity levels thereof. That is, the wavelength of the generated light depends upon the Si concentration of the dopant.

The average wavelength of the LEDs manufactured by use of the wafers obtained by the epitaxial growth method according to the present invention was 938 nm, and a difference between the maximum value and the minimum value was 4 nm. On the other hand, although the average wavelength of the LEDs manufactured by use of the wafers obtained by the prior art method was the same as with the case of that of the present invention, the difference between the maximum value and the minimum value was as large as 11 nm, which indicates that the dopant was added non-uniformly.

Further, the mixing rate of the first source and the second source was examined on the basis of the mixed crystal ratio of Al in the AlGaAs layer obtained by the second source epitaxial growth. The wafers were cleavaged being classified according to three different positions at which the epitaxial grown layers have been formed; that is, the left side (the upstream side of the source injection), the middle portion, and the right side in the epitaxial growth chamber. Further, the mixed crystal ratios of Al near the interface at which the AlGaAs started to grow were measured on the basis of photo-luminescence method. In the wafers manufactured in accordance with the method according to the present invention, the mixed crystal ratios of Al were all 0.3 as previously set. On the other hand, in the wafers manufactured in accordance with the prior art method, the mixed crystal ratios of Al were 0.28, 0.21, 0.11, which were smaller than the set value.

The reduction of the mixed crystal ratio of Al indicates that the first source for the GaAs epitaxial growth is mixed with the second source for the AlGaAs epitaxial growth. Further, the fact that the mixed crystal ratio of Al is reduced much on the downstream side of the source injection in the prior art method may be due to the fact that when the second source is being injected, the second source flows into the epitaxial growth chamber by absorbing the first source remaining at the source passage.

(6) 6th Embodiment of Epitaxial Growth Method and Apparatus

Figures 8A, 8B:
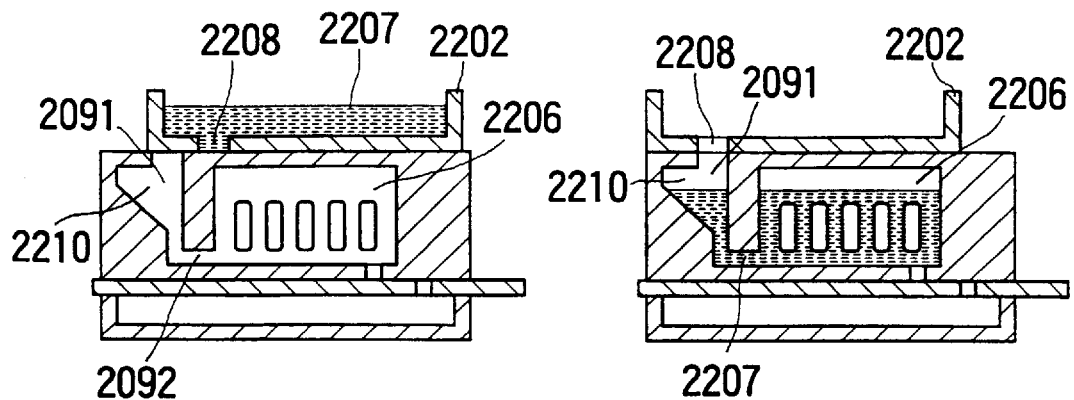
FIGS. 8(a) to 8(b) are longitudinal cross-sectional views showing a sixth embodiment of the epitaxial growth method and apparatus according to the present invention.

FIGS. 8(a) and 8(b) show the sixth embodiment of the epitaxial growth apparatus according to the present invention. In this apparatus, a front chamber 2210 is formed between two source passages 2091 and 2092 both formed to connect a source sump 2202 to an epitaxial growth chamber 2206. However, no control rod is provided to shut off the space between the front chamber 2210 and the epitaxial growth chamber 2206.

FIG. 8(a) shows a state before the epitaxial growth, in which an epitaxial growth source 2207 is put in the source sump 2202. When the epitaxial growth starts, the source sump 2202 is slid to the left side, to inject the source into the epitaxial growth chamber 2206 via the front chamber 2210.

In this embodiment, although the source flows into the front chamber 2210 and then stays for a time, since the source is stirred automatically due to the inflow of the source, the source can be uniformalized. In order to increase the stirring effect by lengthening the stay time of the source, it is preferable to reduce the cross-section areas of the two source passages 2208 and 2091 formed on the upstream side of the front chamber 2210 as compared to that of the source passage 2092 formed on the downstream side of the front chamber 2210.

(7) 7th Embodiment of Epitaxial Growth Method and Apparatus

Figures 9A, 9B:
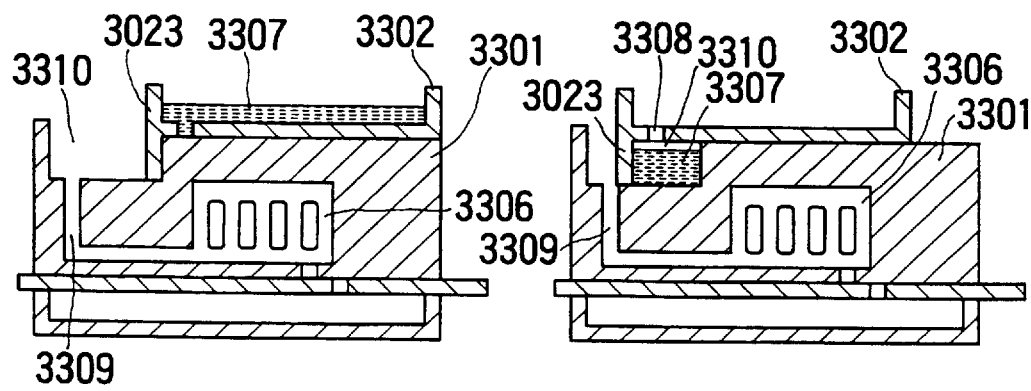
FIGS. 9(a) to 9(c) are longitudinal cross-sectional views showing a seventh embodiment of the epitaxial growth method and apparatus according to the present invention.
Figure 9C:
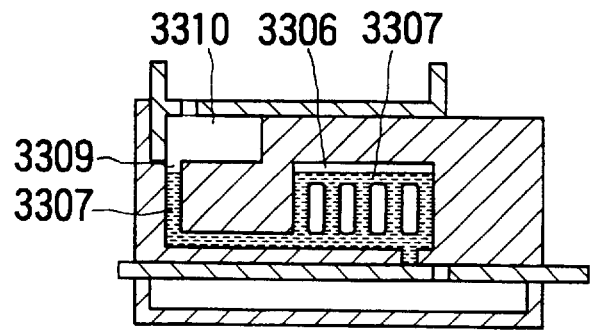

FIGS. 9(a) to 9(c) show the seventh embodiment of the epitaxial growth apparatus according to the present invention, in which a front chamber 3310 is formed on the surface of a boat body 3301. In this embodiment, the flow of the source from the front chamber 3310 to an epitaxial growth chamber 3306 is controlled by the movement of the source sump. A vertical portion 3023 extending from the bottom of the source sump 3302 reaches the bottom of the front chamber 3310.

FIG. 9(a) shows a state before the epitaxial growth, in which an epitaxial growth source 3307 is put in the source sump 3302. When the epitaxial growth starts, the source sump 3302 is slid to the left side, to a state as shown in FIG. 9(b). In this state, an outlet port 3308 of the source sump is opened to the front chamber 3301, but the vertical portion 3023 of the source sump shuts the source passage 3309. Under these conditions, although the source 3307 flows into the front chamber 3301 and is then uniformalized by its flow stirring, the source will not flow into the epitaxial growth chamber 3306. Here, when the source sump is further slid to the left side, as shown in FIG. 9(c), since the front chamber 3310 communicates with the source passage 3309, the source is injected into the epitaxial growth chamber 3306.

In the case of the aforementioned sixth embodiment as shown in FIGS. 8(a) and 8(b), since the source is injected simultaneously into the front chamber and further into the epitaxial growth chamber, there exists a problem in that the source flows into the epitaxial growth chamber before mixed perfectly uniform. In contrast with this, in this seventh embodiment, since the timing at which the source is injected from the front chamber 3310 to the epitaxial growth chamber 3306 can be freely controlled, it is possible to perform the epitaxial growth by use of the source perfectly uniformalized.

Further, when the source sump 3302 is returned to the right side from the state as shown in FIG. 9(b), the liquid surface of the source rises in the front chamber 3301. In this state, since the source sump can be moved right and left on condition that the front chamber 3310 and the source passage 3309 are shut off by the vertical portion 3023 of the source sump, it is possible to stir the source compulsorily.

In the case of the raw material (e.g., GaAs) of the epitaxial growth source, when the GaAs monocrystal is placed in the front chamber 3310, even if the source is not saturated in the source sump, it is possible to obtain a saturated solvent in the front chamber 3310.

(8) 8th Embodiment of Epitaxial Growth Method and Apparatus

Figure 10:
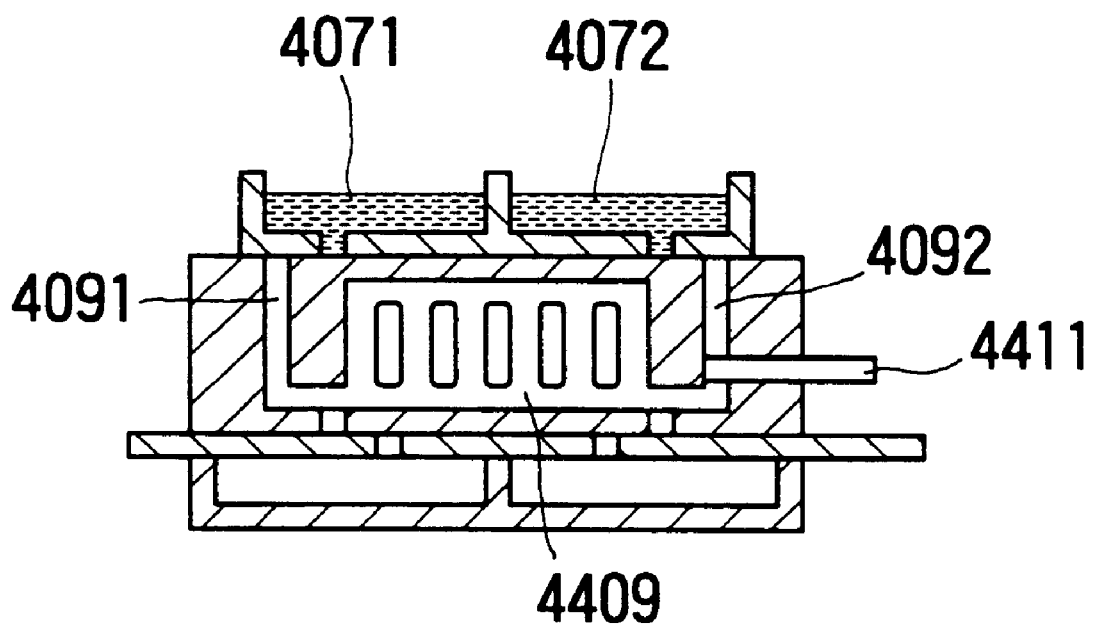
FIG. 10 is a longitudinal cross-sectional views showing an eighth embodiment of the epitaxial growth method and apparatus according to the present invention.

FIG. 10 shows the eighth embodiment of the epitaxial growth apparatus according to the present invention, in which the first source 4071 and the second source 4072 are injected into an epitaxial growth chamber 4409 through two different source passages 4091 and 4092, respectively.

A control rod 4411 is used to shut off only the second source passage 4092, without having a direct function for preventing the first source from being deposited, by exhausting the source remaining in the first source passage 4091. However, since the second source 4072 is injected through the second source passage 4092 different from the first source passage 4091, it is possible to prevent the first source 4071 from being mixed with the second source 4072.

(9) 9th Embodiment of Epitaxial Growth Method and Apparatus

This embodiment relates to the semiconductor liquid phase epitaxial growth apparatus used for dipping method.

Figure 11:
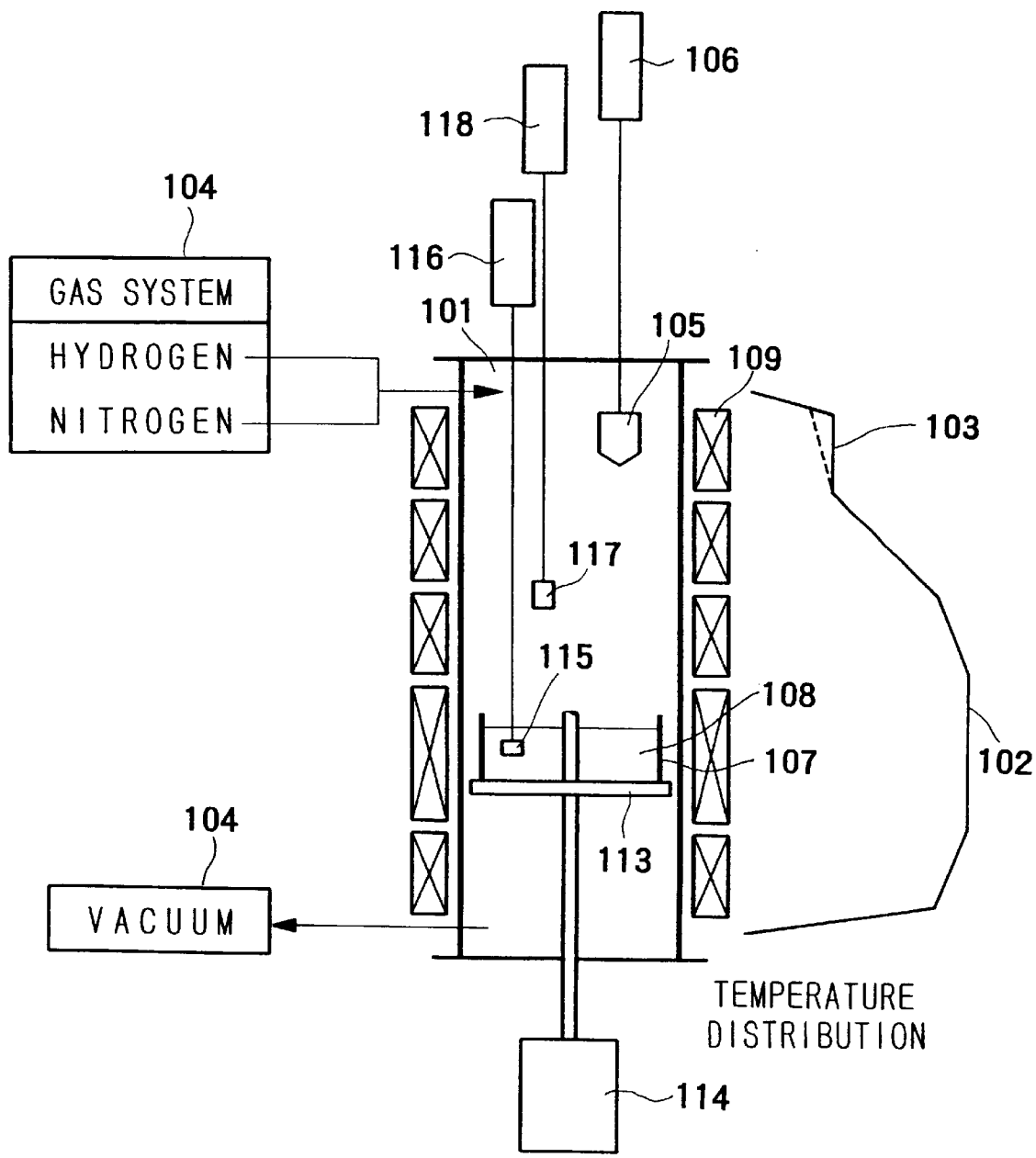
FIG. 11 is a longitudinal cross-sectional views showing a ninth embodiment of the epitaxial growth method and apparatus according to the present invention.

FIG. 11 shows the basic structure thereof. The apparatus is composed of a vertical heating furnace 101 provided with a high temperature uniform-heat section 102 and a low temperature section 103 disposed over the high temperature section uniform-heat section 102; a gas supply system 104 for supplying a reducing gas, an inert gas, and a vacuum to the heating furnace 101; a wafer holder 105 for holding a plurality of wafers; a mechanism 106 for moving the wafer holder up and down; and a source 108 accommodated in a source sump 107 disposed in the high temperature uniform-heat section 102 of the heating furnace 101.

FIG. 11 shows the apparatus of five-stage furnace having five heaters 109, by way of example. However, the number of the heaters is not limited only to five, as far as the high temperature uniform-heat section 102 and the low temperature section 103 can be both obtained. Further, although the low temperature section 103 is shown as a constant temperature area, this low temperature section 103 is used to heat and cool the wafer holder 105 and the wafers for only preparatory, so that this section 103 can be formed into a slightly sloped structure, as shown by a dashed line in FIG. 11.

Japanese Patent Laid-Open No. 60-11571 discloses a method of standing-by the wafers in a low temperature section disposed on the outside of the furnace. In this method, however, the temperature outside the furnace cannot be controlled by the furnace, and in addition there exists a large temperature gradient of the wafers. Therefore, since the wafers are subjected to thermal stress, the crystal defects may occur. To overcome this problem, in the present embodiment, the low temperature section is provided within the furnace so that the temperature of the low temperature section can be well controlled.

Here, when the wafers are moved downward from the wafer stand-by position kept at a low temperature to the epitaxial growth position kept at a high temperature, it is necessary to move the wafers downward at a speed lower than a predetermined value in order to prevent the wafer temperature from being changed abruptly. The wafer movement speed is decided according to the size of the wafers or the temperature gradient of the section for moving the wafers. In other words, the wafers can be moved downward to the epitaxial growth position at higher speed with decreasing size of the wafer and with decreasing temperature gradient of the wafer. As a result, the time required for epitaxial growth process can be shortened.

Therefore, it is preferable that the temperature of the low temperature section (at which the wafers are stood by) is set to a high value from the standpoint of productivity of the epitaxial growth, and further it is important that the temperature of the low temperature section is stabilized from the standpoint of reproducibility of the epitaxial growth.

Further, since a section outside the furnace is directly subjected to the influence of the external air and therefore the temperature thereof cannot be stabilized, it is preferable to dispose the low temperature section whose temperature is controllable. Further, since As is vaporized from the substrate remarkably at about 700 Celsius, when the temperature of the low temperature section is controlled between 500 Celsius and 600 Celsius, it is possible to minimize the process time, without any thermal deterioration of the substrate.

In FIG. 11, two source sumps 107 are mounted on a source sump base 113. The source sump base 107 can be rotated by a driving mechanism 114, so that any one of the two source sumps can be located just under the wafer holder 105. One of the features of this embodiment is to provide a plurality of the source sumps and in addition a mechanism for moving any one of the source sumps just under the wafer holder.

By the construction as described above, since the wafer can be put into the source for epitaxial growth, it is possible to form a plurality of different epitaxial growth layers by use of a plurality of sources in sequence. Without being limited only to the rotational motion, the source sumps can be moved in another way (e.g., straight-line movement), as far as one of a plurality of the source sumps can be located just under the wafer holder 105.

Further, the driving mechanism 114 is provided with a vertical driving mechanism, so that the source 108 can be taken out of the lower side of the heating furnace 101.

Another feature of this embodiment is to provide a mechanism for stirring the source. FIG. 11 shows a stirring blade 115 and a stirring blade drive mechanism 116. Therefore, when this stirring blade 116 is rotated, the source can be stirred. Without being limited only to the rotation of the blade, the blade can be moved up and down or in the horizontal direction or in combination of these motions. The stirring blade can be formed into any desired shape such as a plate, propeller, etc. according to the blade motion. Or else, without being limited only to the blade, it is possible to stir the source by moving an object having a predetermined volume up and down in the liquid surface of the source.

Another feature of this embodiment is to provide the structure that the semiconductor material (which is solute at high temperature for epitaxial growth) is supplied to the source and further saturated. In FIG. 11, a semiconductor material 117 and a mechanism 118 for moving the material up and down are shown. However, in FIG. 11, a mechanism for holding the semiconductor material 117 is not shown.

When the source is supplied being stirred by use of the apparatus of this embodiment, it is possible to obtain the following effects.

In the liquid phase epitaxial growth process, when the wafers are inserted into the source, it is necessary to saturate the source. If the source is not saturated, when the wafers are put into the source, the wafers are dissolved in the source. In contrast with this, when the source is over-saturated, the solute deposited before the wafers are put covers the source surface, this causes a trouble when the wafers are put into the source in particular in the dipping method. Therefore, a solute and a predetermined solvent metal are both put into the source sump at room temperature and then heated, on the basis of such calculation that the source can be saturated by the solute of semiconductor material at the temperature at which the epitaxial growth starts. However, there exists the case where the source is not saturated or conversely oversaturated when the epitaxial growth starts, because of the existence of the non-dissolved solute, an error of the temperature control, a difference in solubility between the calculated value and the actual value, etc.

In the liquid phase epitaxial growth, since the specific gravity of metal solvent is larger than that of the solute, the solute is floated on the surface of the metal solvent. Therefore, in order to dissolve all the solute in the solvent, the solute must diffuse in the solvent, so that a relatively long time is needed. Further, a difference in concentration between the surface and the inner side of the source tends to occur. In the present embodiment, however, since the source is stirred, it is possible to promote the movement of the solute and to uniformalize the source by preventing the solute from being not dissolved. In addition, there exists such an effect of shortening the time interval from when the source is heated to when the source is uniformalized and thereby an epitaxial growth layer can be formed.

Further, the source supply mechanism has such an effect of preventing the solute from being deposited before the epitaxial growth due to over-saturation. Further, it is possible to dissolve the semiconductor material of the solute in the solvent of metal until saturated, by previously adding at room temperature the amount of solute securely remaining under non-saturation condition at the temperature at which the epitaxial growth starts, by heating the solvent at the epitaxial growth start temperature, and then by putting the semiconductor material of solute in the source. When the above-mentioned operation is made at a constant temperature or by raising the temperature, it is possible to prevent the source, from being over-saturated and thereby the solute from being deposited. Here, after the solute has been supplied, in order to prevent the solute from being deposited until the start of the epitaxial growth, it is preferable that the temperature at the end of the solute supply is roughly the same as the temperature at the start of the epitaxial growth.

Since the solute is supplied to the source by stirring the source, the source supply can be completed for a short time. Further, it is preferable to attach the semiconductor material of solute onto the stirring blade or to manufacture the stirring blade itself or a part thereof by use of the semiconductor material of solute. For instance, in the case of GaAs epitaxial growth using a Ga solvent, when the stirring blase is formed of GaAs, it is possible to construct both the stirring mechanism and the source saturation supply mechanism at the same time.

In the apparatus of this embodiment, after the epitaxial growth ends once, the wafers are removed from the wafer holder. Further, new wafers are mounted on the wafer holder. That is, the epitaxial growth can be repeated without changing the source. The source supply mechanism is used only to supply the consumed solute, before the second and after epitaxial growth starts.

In the first epitaxial growth, since the wafer holder is dipped in the source, the liquid surface of the source rises. When the epitaxial growth is made under these conditions, polycrystal is deposited and adhered onto the wall surface of the source sump at a position over the usual liquid surface of the source. In this case, since the source is stirred by moving a stirring object into and from the source as already explained, it is possible to allow the substance deposited at a position higher than the liquid level of the source to be submerged in the source, so that the deposited substance can be dissolved again for reuse.

Here, the practical apparatus structure and the practical method of manufacturing an epitaxial growth wafer will be described hereinbelow, by taking the case where an infrared LED as shown in FIG. 12(b) is manufactured by use of the apparatus as shown in FIG. 11. Here, a GaAs epitaxial growth layer doped by Si is obtained by use of Ga as the source solvent and GaAs and Si as the solute.

The heating furnace shown in FIG. 11 is of vertical five-stage heater furnace. The length of the furnace body is 150 cm, and the diameter of the quartz reaction tube disposed in the furnace is 30 cm. The length of the high temperature uniform-heat section 102 is 30 cm within temperature range of "0.5 Celsius. Further, when the high temperature uniform-heat section 102 is heated up to 1000 Celsius, the temperature of the low temperature section 103 has a temperature gradient from 482 Celsius to 514 Celsius within a range of 30 cm.

The source sump base 113 has a diameter of 28 cm and is formed of quartz. The drive shaft thereof is a quartz tube having a diameter of 12 cm. The drive mechanism 114 can rotate the source sump base 113 by 180 degrees.

As shown in FIGS. 13(a) and 13(b), the structure of the source sump 107 is such that two source sumps 1071 and 1072 are formed integral with each other. The source sump 107 is formed of carbon and formed into rectangular box shape. The width thereof is 17.5 cm; the depth thereof is 21.9 cm; and the height thereof is 20 cm in such a way that the diagonal line thereof is about 28 cm. In this box shape, two rectangular hollow portions having a width of 8 cm, a depth of 20.9 cm and a depth of 19 cm are formed as the first source sump 1071 and the second source sump 1072, respectively. Further, the thickness of the wall between the outer wall of the source sump and the hollow portion of the source sump is 0.5 cm, and the thickness of the bottom thereof is 1 cm.

The stirring blade 115 is a quartz plate which is 5.6 cm wide, 8 cm long and 0.8 cm thick. The rod for driving the blade is a quartz rod having a diameter of 1.4 cm. The drive mechanism 116 rotates the stirring blade via the quartz rod and further moves the same blade up and down.

The semiconductor material 117 is disk-shaped GaAs monocrystal having a diameter of 5 cm and a thickness of 2.4 cm, and the drive rod is a quartz rod having a diameter of 1.4 cm. The drive mechanism 118 moves the GaAs disk via the quartz rod and further rotates the same disk.

A gas system 104 supplies hydrogen, nitrogen and a mixture gas of both into the heating furnace, and further can evacuate the heating furnace into a vacuum.

The wafer holder 105 is formed of carbon, which is formed by laminating the holder plates 14c as shown in FIG. 6(b). The structure of this wafer holder is such that as shown in FIGS. 2(a) to 2(c). The material of the wafer holder must be provided with heat resistance and chemical resistance against the epitaxial growth source. Further, it is preferable that the wafer holder material is easy to be mechanically processed with a high precision. Further, it is also preferable to manufacture the wafer holder by use of a material in which a base material is coated with another material. In practice, the wafer holder material is quartz, silicon carbide, sapphire, other ceramics, etc.

The results of the epitaxial growth layer formed in accordance with the above-mentioned embodiment will be described hereinbelow.

The first source sump was used for GaAs epitaxial growth. Into the first source sump, metal Ga of 7500 g was put as the solvent, and polycrystal GaAs of 1197 g and silicon piece of 22.5 g were put as the solute. Further, the second source sump was used for AlGaAs epitaxial growth. Into the second source sump, metal Ga of 7500 g was put as the solvent, and polycrystal GaAs of 238.1 g and Al wire of 36.7 g were put as the solute.

The wafer holder was made by stacking 49-piece holder plates and by housing these stacked holder plates in a box-shaped cassette together. Further, 98 pieces of Si-doped N-type GaAs wafers with a thickness 300 $\mu$m were all attached to the holder plates, respectively. After that, the wafer holder was disposed at the low temperature section of the heating furnace. Further, the semiconductor material 117 and the stirring blade 115 were placed at the low temperature section.

Further, the position of the source sump base 113 was adjusted so that the first source sump was located just under the stirring blade and the semiconductor material.

Under these conditions, the furnace was once evacuated into a vacuum, and then filled with hydrogen. After the furnace pressure was kept at the normal pressure, hydrogen was kept flowing at a rate of 5 liter per minute.

The moment that the furnace pressure reached the normal pressure, the furnace was heated. After two hours, the furnace temperature was raised up to 915 Celsius at which the epitaxial growth was started.

With respect to the GaAs epitaxial growth source put in the first source sump, GaAs of 30 g is not saturated as the result of calculation. Therefore, when the furnace temperature reached 915 Celsius, the semiconductor material 117 was moved downward into the GaAs epitaxial growth source put in the first source sump, and then rotated for 30 min at speed of 15 rpm. By this process, GaAs and Si both first put into the source sump were dissolved perfectly. Further, as the result of the weight measurement of the semiconductor material 117 after the epitaxial growth, it was confirmed that 32.5 g was dissolved into the source.

After the source was stirred for 30 min, the semiconductor 117 was pulled upward, and then source sump base 113 was rotated by 180 degrees. By this half rotation, the GaAs epitaxial growth source sump was located just under the wafer holder 105, and the AlGaAs epitaxial growth source sump was located just under the stirring blade 115.

Successively, the wafer holder was moved downward to such a position where the wafer holder was not dipped into the liquid surface of the source, and then kept at this position for 10 min. This position corresponds to the uniform-heat zone, so that the temperature of the wafers can be kept roughly at the same temperature as that of the source.

After 10 min, the wafer holder was further moved downward into the source, and further the source temperature was lowered at a rate of 0.4 Celsius per minute to start the epitaxial growth. Further, when the source temperature was lowered down to 860 Celsius, the wafer holder was pulled up to complete the epitaxial growth.

During this time interval, GaAs was deposited on the wafer as an epitaxial growth layer. Here, since the dopant Si was reversed naturally, in the first half of the epitaxial growth, an N-type GaAs epitaxial growth layer was formed, but in the second half of the epitaxial growth at about 880 Celsius (lower than the inversion temperature), a P-type GaAs epitaxial growth layer was formed.

During the GaAs epitaxial growth, the stirring blade 115 was moved downward into the AlGaAs epitaxial growth source put in the second source sump, and then rotated at a speed of 15 rpm, to dissolve the source solute of AlGaAs and Al perfectly.

At the same time when the GaAs epitaxial growth was completed at 860 Celsius, this temperature was maintained. The stirring blade 115 and the wafer holder 105 were pulled out of the source, respectively, and then the source sump base 113 was half rotated again to exchange the first source sump position with the second source sump position.

During the source exchange, although the wafer holder was taken out of the source sump, the wafer holder was maintained within the high temperature uniform-heat area in the furnace. Here, the reason why the wafer holder was not pulled up outside the furnace or to the low temperature section in the furnace is to simplify the epitaxial growth process, by keeping the temperature of the wafer holder at the same temperature of that of the source, that is, by eliminating the preparatory heating process required before the succeeding epitaxial growth start. In the epitaxial growth method according to the present invention as described above, since the wafer holder of high air tightness was used, even if the wafers were kept at a high temperature, it was possible to prevent the wafers from being deteriorated thermally.

Successively, the wafer holder was dipped into the second source sump for the AlGaAs epitaxial growth.

The source temperature was lowered at a rate of 0.4 Celsius per minute to start the epitaxial growth. Further, when the source temperature was lowered down to 820 Celsius, the wafer holder was pulled up to the low temperature section, to complete the epitaxial growth.

By this process, a AlGaAs epitaxial growth layer was formed on the GaAs epitaxial growth layer.

After the epitaxial growth was completed, the furnace temperature was lowered. When the temperature of the low temperature section was lowered below 200 Celsius, hydrogen was replaced with nitrogen, and then the wafer holder and the wafers were taken out.

FIG. 12($a$) shows the structure of the wafer obtained in accordance with the above-mentioned process, in which an N-type GaAs epitaxial growth later 92 with a thickness of 60 $\mu$m, a P-type GaAs epitaxial growth later 93 with a thickness of 40 $\mu$m, and a non-doped AlGaAs (the mixed crystal ratio of Al is 0.7) epitaxial growth later 94 with a thickness of 10 $\mu$m are grown in sequence on an N-type GaAs wafer 91. The surfaces of the epitaxial growth layers were all smooth.

Further, when the obtained wafer was etched at 50 Celsius by hydrofluoric acid, only the AlGaAs layer 94 was etched, so that the epitaxial growth wafer as shown in FIG. 12($b$) can be obtained Further, 25-piece wafers of the 98-pieces of the wafers constructed as shown in FIG. 12($b$) were cleavaged and further stain-etched, to examine the GaAs epitaxial growth layers at five points of each wafer. The N-type GaAs layer was 58.4 $\mu$m in average thickness and 4.2 $\mu$m in standard deviation; and the P-type GaAs layer was 38.8 $\mu$m in average thickness and 2.9 $\mu$m in standard deviation.

The two obtained average thicknesses of the two epitaxial growth layers well matched with the design values of 60 $\mu$m and 40 $\mu$m, respectively, and the standard deviation thereof was improved markedly, as compared with the precision of film thickness of "30% obtained by the prior art epitaxial growth method.

In the above-mentioned description, the Si-doped GaAs epitaxial growth and the non-doped AlGaAs epitaxial growth by use of Ga as the solute are explained by way of example. The epitaxial growth method and apparatus according to the present invention can be of course applied to the liquid phase epitaxial growth of the other compound semiconductors of GaAs, AlGaAs, Gap, etc. using another dopant, and further to Si liquid phase epitaxial growth using Sn or Ga as the solvent.

As described above, in the liquid phase epitaxial growth method and apparatus and the wafer holder according to the present invention, since the wafer holder can hold the wafers in such a way that the wafers are opposed to each other and further since the wafer peripheries are all covered to restrict the unnecessary epitaxial growth source existing at the wafer peripheries, it is possible to prevent polycrystal from being deposited within the epitaxial growth apparatus and to suppress the source solute from being diffused from the wafer periphery to the wafer edge, with the result that it is possible to obtain an epitaxial growth layer of uniform thickness and composition.

Further, in the epitaxial growth apparatus according to the present invention, since the epitaxial growth source is uniformalized and since it is possible to prevent unnecessary source and polycrystal from being deposited in the passage for supplying source into the wafer holder, a uniform epitaxial growth layer of excellent controllability can be obtained, in particular when a multiple (two or more) liquid phase epitaxial growth layers is required to be formed.

What is claimed is:

1. A wafer holder, comprising:
    a holder body having:
        at least one wafer accommodating space in which at least one pair of semiconductor wafers can be held in such a way that reverse surfaces of the two wafers are brought into contact with inner side walls thereof and right surfaces of the two wafers are opposed to each other with a predetermined space between the two; and an inlet and outlet port for injecting and exhausting a source into and out of the wafer accommodating space or an inlet port for injecting the source into the wafer accommodating space and an outlet port for exhausting the source from the wafer accommodating space; and a holder cover for covering an open surface of the holder body, wherein the wafer accommodating space of the wafer holder body is formed with less than 0.5 mm between an outer edge of the semiconductor wafer and a wall to which the outer edge of the semiconductor wafer is close, to restrict an amount of the source entering an outer edge portion of the semiconductor wafer and thereby to prevent an epitaxial growth raw material contained in the source from being diffused to the edge portion of the semiconductor wafer.

2. The wafer holder of claim 1, wherein the gap between the wall of the wafer accommodating space and the outer edge of the semiconductor wafer is 4.9 mm or less.

3. The wafer holder of claim 1, wherein the semiconductor wafer is held with a predetermined gap between the outer edge of the semiconductor wafer and the wall to which the outer edge of the semiconductor wafer is close, in the wafer accommodating space of the holder body, the gap extending all over a circumference of the outer edge of the semiconductor wafer, except portion where the inlet and outlet port or the inlet port and the outlet port are formed.

4. The wafer holder of claim 1, wherein the wall to which the outer edge of the semiconductor wafer is close in the wafer accommodating space of the holder body is formed with a taper portion or a stepped portion in such a way that a diameter of the taper portion or the stepped portion formed on the reverse surface side of the semiconductor wafer is larger than that formed on the right surface side thereof.

5. The wafer holder of claim 4, wherein a minimum diameter of the taper portion or the stepped portion formed in the wall of the wafer accommodating space of the holder body is larger than a value obtained by subtracting 4 mm from a diameter of the semiconductor wafer.

6. The wafer holder of claim 4; wherein a minimum diameter of the taper portion or the stepped portion formed in the wall of the wafer accommodating space of the holder body is larger than a diameter of a non-chamfered portion of the semiconductor wafer.

7. The wafer holder of claim 1, wherein the holder body is formed with a U-shaped or semi-circular pocket in the semiconductor wafer accommodating space in such a way as to be fitted to an outer periphery of the semiconductor wafer when the semiconductor wafer is inserted into the wafer accommodating space from an opening surface side of the U-shaped or semi-circular pocket, and wherein the holder cover for covering the holder body is formed with a semi-circular surface so as to be fitted to the outer periphery of the semiconductor wafer.

8. A holder body, comprising at least two sets of:

a holder plate having a disk-shaped wafer holding plate formed with a U-shaped or half-circular groove portion formed so as to enclose a peripheral portion of the disk-shaped wafer holding plate except an opening surface of the wafer holding plate, a least one pair of semiconductor wafers being fitted to the groove portion in such a way that two reverse surfaces of the two semiconductor wafers are brought into contact with both surfaces of the wafer holding plate, respectively in back-to-back arrangement; and a holder cover formed with a U-shaped or half-circular groove portion so as to be fitted to the outer peripheries of the semiconductor wafers and to cover the opening surface of the wafer holding plate, the outer edges of the semiconductor wafers held by the wafer holding plate being further held by the groove portion of the holder cover; and wherein when the holder plates and the holder covers are stacked upon each other, two right surfaces of the two semiconductor wafers being opposed to each other two by two with a predetermined space between the two.

9. A holder body, comprising at least two sets of:

a holder plate having a wafer holding plate formed with a U-shaped or half-circular groove portion formed so as to enclose a peripheral portion of the wafer holding plate except an opening surface of the wafer holding plate, an outer edge of the semiconductor wafer being fitted to the groove portion in such a way that a reverse surface of one semiconductor wafer is brought into contact with an inner bottom surface of the wafer holding plate; and a holder cover formed with a U-shaped or half-circular groove portion so as to be fitted to the outer periphery of the semiconductor wafer and to cover the opening surface of the wafer holding plate, the outer edge of the semiconductor wafer held by the wafer holding plate being further held by the groove portion of the holder cover; and wherein another holder plate is mounted on an upper surface of a set of the holder plate and the holder cover for holding a single semiconductor wafer in such a way that another semiconductor wafer can be sandwiched between the two holder plates, two right surfaces of the two semiconductor wafers being opposed to each other two by two with a predetermined space between the two.

10. The wafer holder of claim 8, where the groove portion of the wafer holding plate is formed with an inlet port for injecting a source and an outlet port for exhausting the source, a height difference roughly more than a half of a thickness of the semiconductor wafer held by the wafer holding plate being formed at the inlet and outlet port.

11. The wafer holder of claim 8, where the predetermined space formed between the two semiconductor wafers held by the two sets of the wafer holding plates and the holder covers, respectively so as to be opposed to each other is about 0.3 mm to 5.0 mm.

12. An epitaxial growth apparatus, comprising:

a source sump for accommodating a source used for liquid phase epitaxial growth;

an epitaxial growth chamber located under the source sump, for accommodating semiconductor wafers;

a source passage provided between the source sump and the epitaxial growth chamber; and a front chamber disposed in a part of the source passage, and wherein when the source accommodated in the source sump is introduced into the epitaxial growth chamber through the source passage, the source is stirred in the front chamber.

13. The epitaxial growth apparatus of claim 12, which further comprises an exhaust source sump communicating with the source passage via a source shut-off section, when the source shut-off section is opened, the source remaining in the source passage and/or the front chamber being exhausted into the exhaust source sump.

14. An epitaxial growth apparatus, comprising:
a source sump for accommodating sources of at least two sorts each used for liquid phase epitaxial growth, separately;
an epitaxial growth chamber located under the source sump, for accommodating semiconductor wafers; and
a source passage disposed between the source sump and the epitaxial growth chamber connected to a bottom portion of the epitaxial growth chamber, separately for each source.

15. The epitaxial growth apparatus of claim 14, which further comprises an exhaust source sump communicating with the source passage via a source shut-off section, when the source shut-off section is opened, the source remaining in the source passage being exhausted into the exhaust source sump.

16. The epitaxial growth apparatus of claim 14, which further comprises an exhaust source sump communicating with the source passage via a source shut-off section, separately for each source, when the source shut-off section is opened, the source remaining in the source passage being exhausted into the exhaust source sump, separately for each source.

17. An epitaxial growth apparatus, comprising:
a source sump for accommodating a source used for liquid phase epitaxial growth;
a wafer holder for holding semiconductor wafers, including:
a holder body formed with:
a wafer accommodating space in which at least one pair of semiconductor wafers can be held in such a way that reverse surfaces of the two wafers are brought into contact with an inner side wall thereof and further right surfaces of the two wafers are opposed to each other with a predetermined space between the two; and
an inlet and outlet port for injecting and exhausting the source into and out of the wafer accommodating space, or an inlet port for injecting the source into the wafer accommodating space and an outlet port for exhausting the source out of the wafer accommodating space; and
a wafer holder cover for covering an opening surface of the holder body;
an epitaxial growth chamber located under the source sump, for accommodating the semiconductor wafers held by the wafer holder;
a source passage disposed between the source sump and the epitaxial growth chamber;
a front chamber disposed in a part of the source passage; and
wherein when the source accommodated in the source sump is introduced into the epitaxial growth chamber through the source passage, the source is stirred in the front chamber.

18. A semiconductor liquid phase epitaxial growth apparatus, comprising:
a heating furnace having:
a high temperature uniform-heat section heated by heating means so as to form a roughly uniform temperature distribution, and
a low temperature section located over the high temperature uniform-heat section and kept at a temperature lower than that of the high temperature uniform-heat section;
gas supplying means for supplying a reducing gas and/or an inert gas into the heating furnace;
a source sump disposed at the high temperature uniform-heat section in the heating furnace, for accommodating a source in which a solute containing semiconductor material used for epitaxial growth is dissolved in a solvent containing a metal;
a wafer holder for holding a plurality of semiconductor wafers;
wafer holder moving means for moving the wafer holder in vertical direction in the heating furnace, to dip the semiconductor wafers held by the wafer holder into the source accommodated in the source sump during epitaxial growth;
stirring means having a stirring blade for stirring the source accommodated in the source sump; and
blade moving means for moving the stirring means in the vertical direction to put the stirring means into or out of the source.

19. The semiconductor liquid phase epitaxial growth apparatus of claim 18, which further comprises:
a semiconductor material containing an element for constituting the solute;
a semiconductor material holding structure body for holding the semiconductor material; and
semiconductor material moving means having a stirring blade, for moving the semiconductor material holding structure body in vertical direction to put the semiconductor material in and out of the source accommodated in the source sump.

20. The semiconductor liquid phase epitaxial growth apparatus of claim 18, wherein at least a part of the stirring blade is formed of a semiconductor material containing an element for constituting the solute.

21. A semiconductor liquid phase epitaxial growth apparatus, comprising:
a heating furnace having:
a high temperature uniform-heat section heated by heating means so as to form a roughly uniform temperature distribution, and
a low temperature section located over the high temperature uniform-heat section and kept at a temperature lower than that of the high temperature uniform-heat section;
gas supplying means for supplying a reducing gas and/or an inert gas into the heating furnace;
a source sump disposed at the high temperature uniform-heat section in the heating furnace, for accommodating a source in which a solute containing semiconductor material used for epitaxial growth is dissolved in a solvent containing a metal;
a wafer holder for holding semiconductor wafers, including:
a holder body formed with:
a wafer accommodating space in which at least one pair of semiconductor wafers can be held in such a way that reverse surfaces of the two wafers are brought into contact with an inner side wall thereof and further right surfaces of the two wafers are opposed to each other with a predetermined space between the two; and
an inlet and outlet port for injecting and exhausting the source into and out of the wafer accommodating space, or an inlet port for injecting the source into the wafer accommodating space and an outlet port for exhausting the source out of the wafer accommodating space; and a wafer holder cover for covering an opening surface of the holder body;

wafer holder moving means for moving the wafer holder in vertical direction in the heating furnace, to dip the semiconductor wafers held by the wafer holder into the source accommodated in the source sump during epitaxial growth;

stirring means having a stirring blade for stirring the source accommodated in the source sump; and blade moving means for moving the stirring means in the vertical direction to put the stirring means into or out of the source.

22. A semiconductor liquid phase epitaxial growth method comprising:

a step of holding a plurality of semiconductor wafers by a wafer holder;

a step of holding the wafer holder for holding the semiconductor wafers, in a low temperature region of a heating furnace having a high temperature uniform-heat region heated by heating means to form a roughly uniform temperature distribution and the low temperature region located over the high temperature uniform-heat region and kept at a temperature lower than that of the high temperature uniform-heat region;

a step of flowing a reducing gas and/or an inert gas into the heating furnace;

a step of heating the heating furnace by the heating means so that the high temperature uniform-heat region becomes a predetermined temperature;

a step of stirring a source accommodated in a source sump, in which a solute containing a semiconductor material used for epitaxial growth is dissolved in a solvent containing metal, using a stirring means;

a step of moving the wafer holder downward from the low temperature region to the high temperature uniform-heat region, to raise temperature of the wafer holder and the semiconductor wafers to the predetermined temperature;

a step of moving the wafer holder and the semiconductor wafers downward, to dip the wafer holder and the semiconductor wafers into the source accommodated in the source sump;

a step of lowering temperature of the high temperature uniform-heat region for epitaxial growth on the semiconductor wafers; and a step of pulling the wafer holder out of the source to complete the epitaxial growth.

23. A semiconductor liquid phase epitaxial growth method comprising:

a step of holding a plurality of semiconductor wafers by a wafer holder;

a step of holding the wafer holder for holding the semiconductor wafers, in a low temperature region of a heating furnace having a high temperature uniform-heat region heated by heating means to form a roughly uniform temperature distribution and the low temperature region located over the high temperature uniform-heat region and kept at a temperature lower than that of the high temperature uniform-heat region;

a step of flowing a reducing gas and/or an inert gas into the heating furnace;

a step of heating the heating furnace by the heating means so that the high temperature uniform-heat region becomes a predetermined temperature;

a step of stirring a first source being put in a first source sump, a first source and a second source being put in a first source sump and a second source sump, separately in the high temperature uniform-heat region of the heating furnace, using a stirring means;

a step of moving the wafer holder downward from the low temperature region to the high temperature uniform-heat region, to raise temperature of the wafer holder and the semiconductor wafers to a predetermined temperature;

a step of moving the wafer holder and the semiconductor wafers downward into the first source;

a step of lowering temperature of the high temperature uniform-heat region, to form a first epitaxial growth layer on the semiconductor wafers;

a step of pulling the wafer holder out of the first source, to complete the first epitaxial growth;

a step of stirring the second source in the second source sump using the stirring means;

a step of moving the wafer holder and the semiconductor wafers downward into the second source;

a step of lowering temperature of the high temperature uniform-heat region, to form a second epitaxial growth layer on a surface of the formed first epitaxial growth layer; and a step of pulling the wafer holder out of the second source to complete the second epitaxial growth.

24. A semiconductor liquid phase epitaxial growth method comprising:

a step of holding a plurality of semiconductor wafers by use of a wafer holder including: a holder body formed with: a wafer accommodating space in which at least one pair of semiconductor wafers can be held in such a way that reverse surfaces of the two wafers are brought into contact with an inner side wall thereof and further right surfaces of the two wafers are opposed to each other with a predetermined space between the two; and an inlet and outlet port for injecting and exhausting the source into and out of the wafer accommodating space, or an inlet port for injecting the source into the wafer accommodating space and an outlet port for exhausting the source out of the wafer accommodating space; and a wafer holder cover for covering an opening surface of the holder body;

a step of holding the wafer holder for holding the semiconductor wafers, in a low temperature region of a heating furnace having a high temperature uniform-heat region heated by heating means to form a roughly uniform temperature distribution and the low temperature region located over the high temperature uniform-heat region and kept at a temperature lower than that of the high temperature uniform-heat region;

a step of flowing a reducing gas and/or an inert gas into the heating furnace;

a step of heating the heating furnace by the heating means so that the high temperature uniform-heat region becomes a predetermined temperature;

a step of stirring a source accommodated in a source sump, in which a solute containing a semiconductor material used for epitaxial growth is dissolved in a solvent containing metal, using a stirring means;

a step of moving the wafer holder downward from the low temperature region to the high temperature uniform-heat region, to raise temperature of the wafer holder and the semiconductor wafers to a predetermined temperature;

a step of moving the wafer holder and the semiconductor wafers downward, to dip the wafer holder and the semiconductor wafers into the source accommodated in the source sump;

a step of lowering temperature of the high temperature uniform-heat region, for epitaxial growth on the semiconductor wafers; and a step of pulling the wafer holder out of the source to complete the epitaxial growth.

* * * * *